US012529392B2

(12) United States Patent
Shindo et al.

(10) Patent No.: US 12,529,392 B2
(45) Date of Patent: Jan. 20, 2026

(54) REFILL

(71) Applicant: Max Co., Ltd., Tokyo (JP)

(72) Inventors: Takushi Shindo, Tokyo (JP); Futoshi Kameda, Tokyo (JP); Kazuhiko Kishi, Tokyo (JP)

(73) Assignee: Max Co., Ltd., Tokyo (JP)

( * ) Notice: Subject to any disclaimer, the term of this patent is extended or adjusted under 35 U.S.C. 154(b) by 0 days.

(21) Appl. No.: 18/680,046

(22) Filed: May 31, 2024

(65) Prior Publication Data

US 2024/0401625 A1  Dec. 5, 2024

(30) Foreign Application Priority Data

May 31, 2023  (JP) ................................ 2023-090294

(51) Int. Cl.
*F16B 15/08* (2006.01)
*B27F 7/38* (2006.01)
*F16B 15/00* (2006.01)

(52) U.S. Cl.
CPC .......... *F16B 15/08* (2013.01); *F16B 15/0015* (2013.01); *B27F 7/38* (2013.01)

(58) Field of Classification Search
CPC ......... B25C 5/00; B25C 5/1637; B65H 37/04; B27F 7/38; F16B 15/0015; F16B 15/08
USPC .......................... 206/338, 340; 227/119, 120
See application file for complete search history.

(56) References Cited

U.S. PATENT DOCUMENTS

| 2006/0144890 A1 | 7/2006 | Haramiishi et al. |
| 2010/0193563 A1 | 8/2010 | Haramiishi et al. |
| 2011/0290849 A1 | 12/2011 | Haramiishi et al. |
| 2012/0298538 A1 | 11/2012 | Haramiishi et al. |
| 2012/0298714 A1 | 11/2012 | Haramiishi et al. |
| 2012/0298715 A1 | 11/2012 | Haramiishi et al. |
| 2013/0087595 A1 | 4/2013 | Haramiishi et al. |
| 2013/0092578 A1 | 4/2013 | Sugihara et al. |
| 2013/0292447 A1 | 11/2013 | Haramiishi et al. |
| 2013/0323914 A1 | 12/2013 | Liao |
| 2014/0329375 A1 | 11/2014 | Liao |
| 2019/0143557 A1 | 5/2019 | Shimizu et al. |
| 2019/0275697 A1 | 9/2019 | Shimizu et al. |
| 2021/0008754 A1 | 1/2021 | Shimizu et al. |

FOREIGN PATENT DOCUMENTS

| JP | H04-122474 A | 4/1992 |
| JP | H04-122474 U | 11/1992 |
| JP | 2004-237446 A | 8/2004 |

(Continued)

OTHER PUBLICATIONS

Sep. 4, 2024—(EP) Extended Search Report—App 24179412.2.

*Primary Examiner* — Chun Hoi Cheung
(74) *Attorney, Agent, or Firm* — Banner & Witcoff, Ltd.

(57) ABSTRACT

A refill includes: a bottom wall; a first side wall; a second side wall; and a front wall in which a discharge opening is formed. The first side wall includes, in a part thereof in a stacking direction, a first inclined wall extending in a coupling direction of staples and inclined in an axial direction. The second side wall includes, in a part thereof in the stacking direction, a second inclined wall extending in the coupling direction of the staples and inclined in the axial direction. The first inclined wall and the second inclined wall are inclined in the same direction, and at least a part of the first inclined wall and at least a part of the second inclined wall are formed at the same height from a bottom surface of the bottom wall in the stacking direction.

20 Claims, 29 Drawing Sheets

(56) References Cited

FOREIGN PATENT DOCUMENTS

| | | |
|---|---|---|
| JP | 2013-086284 A | 5/2013 |
| JP | 2019-089322 A | 6/2019 |
| WO | 2004-069487 A1 | 8/2004 |

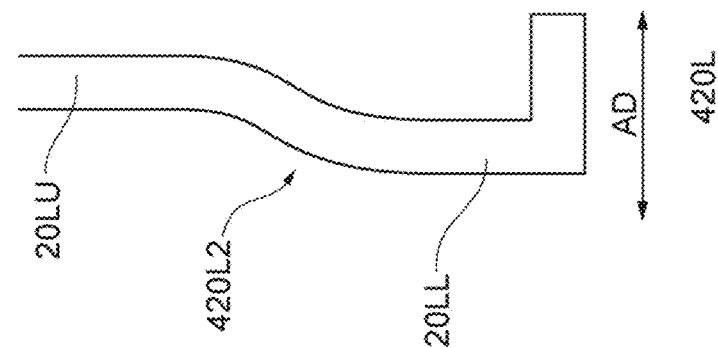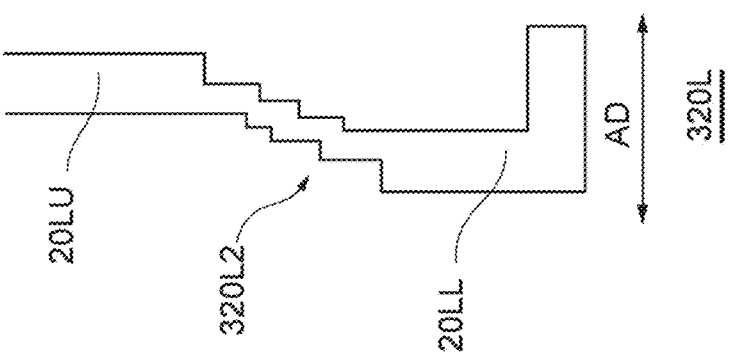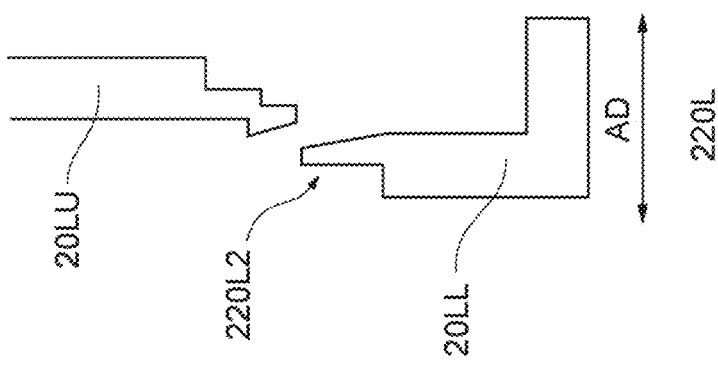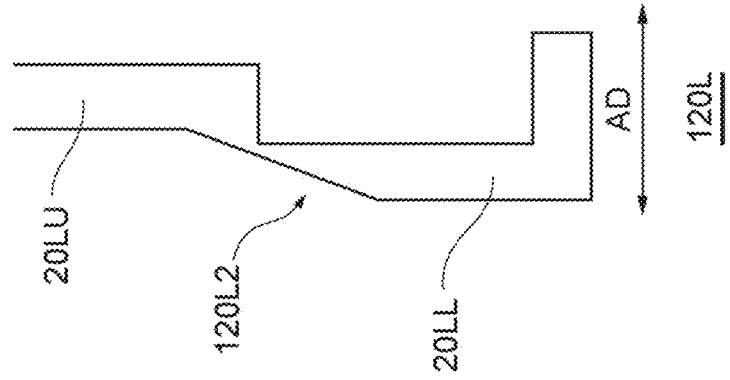

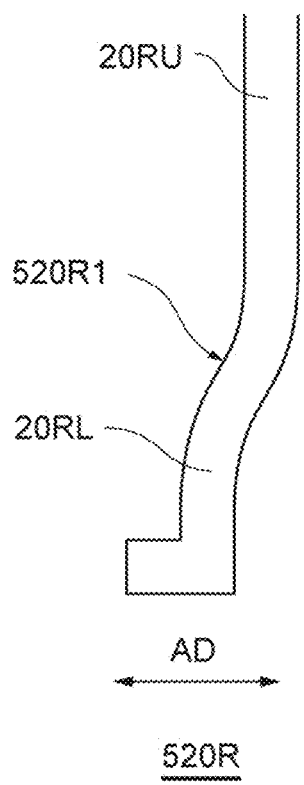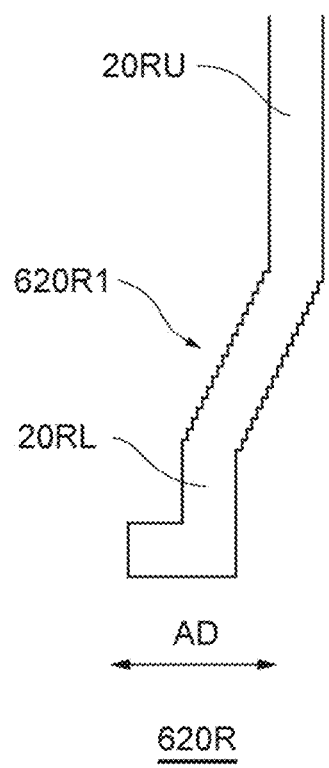

REFILL

CROSS-REFERENCE TO RELATED APPLICATIONS

This application is based on and claims priority under 35 USC § 119 from Japanese Patent Application No. 2023-090294 filed on May 31, 2023, the contents of which are incorporated herein by reference.

TECHNICAL FIELD

The present disclosure relates to a refill that accommodates staple sheets.

BACKGROUND ART

In the related art, an electric stapler for automatically performing a stapling process (paper binding process) has been widely used. As the electric stapler, for example, one built in a post-processing apparatus (finisher) installed in a downstream process of an image forming apparatus such as a copier or a printer, or one of a desktop type (single body) are known.

A general electric stapler includes a main body to which a cartridge is attached. In the cartridge, a refill accommodating stacked staple sheets each obtained by coupling a plurality of staples, each of which extends substantially straight, in parallel in a direction perpendicular to the extending direction (axial direction) is loaded (attached) in a replaceable manner (for example, Patent Literatures 1 to 5).

In response to start of a stapling process, the electric stapler sequentially feeds the staple sheet accommodated in the refill to a feeding portion, and the staple located at a tip end of the staple sheet fed to the feeding portion is shaped into, for example, a U-shape by a forming plate. Thereafter, the shaped staple is driven into paper using a driver, and the staple that has penetrated the paper is clinched (bent) to perform the stapling process.

Patent Literature 1: JP2019-89322A
Patent Literature 2: JP2004-237446A
Patent Literature 3: WO2004/069487
Patent Literature 4: JP2013-86284A
Patent Literature 5: Microfilm of Japanese Utility Model Application No. H03-33409 (JPH04-122474U)

However, in such a refill, blocking may occur in which upper and lower staple sheets adhere to each other. When the blocking occurs, the staple sheet may not be successfully fed out.

Therefore, an object of the present disclosure is to provide a refill capable of preventing adhesion (blocking) between staple sheets.

SUMMARY OF INVENTION

The present application discloses a refill for a staple sheet. The staple sheet is obtained by coupling a plurality of staples, each of which extends in an axial direction, in a direction orthogonal to the axial direction. The refill includes a bottom wall on which a plurality of the staple sheets are stacked and placed; a first side wall facing one end portion of each of the stacked staple sheets in the axial direction and erected in a stacking direction from the bottom wall; a second side wall facing another end portion of each of the stacked staple sheets in the axial direction and erected in the stacking direction from the bottom wall; and a front wall positioned between an end portion of the first side wall in a coupling direction of the staples and an end portion of the second side wall in the coupling direction of the staples and in which a discharge opening for discharging the staple sheets in the coupling direction of the staples is formed. In addition, the first side wall includes, in a part thereof in the stacking direction, a first inclined wall extending in the coupling direction of the staples and inclined in the axial direction.

Further, the second side wall may include, in a part thereof in the stacking direction, a second inclined wall extending in the coupling direction of the staples and inclined in the axial direction.

Further, the first inclined wall and the second inclined wall may be inclined in the same direction, and at least a part of the first inclined wall and at least a part of the second inclined wall may be formed at the same height from a bottom surface of the bottom wall in the stacking direction.

Further, the present application discloses a refill configured to accommodate a staple sheet. The refill includes a bottom wall; a first side wall erected in a first direction from the bottom wall; a second side wall facing the first side wall and erected in the first direction from the bottom wall; and a front wall positioned between an end portion of the first side wall in a second direction orthogonal to the first direction and an end portion of the second side wall in the second direction, and in which a discharge opening for discharging a staple sheet to be placed on the bottom wall in the second direction is formed at a position adjacent to the bottom wall in a third direction that is an opposite direction of the first direction. The first side wall includes, in a part thereof in the first direction, a first inclined wall extending in the second direction and inclined in a fourth direction orthogonal to the first direction and the second direction.

Further, the second side wall may include, in a part thereof in the first direction, a second inclined wall extending in the second direction and inclined in the fourth direction.

Further, the first inclined wall and the second inclined wall may be inclined in the same direction, and at least a part of the first inclined wall and at least a part of the second inclined wall may be formed at the same height from a bottom surface of the bottom wall in the first direction.

BRIEF DESCRIPTION OF DRAWINGS

FIG. 13A is a schematic diagram showing a modification of the refill according to the embodiment.

FIG. 13B is a schematic diagram showing a modification of the refill according to the embodiment.

FIG. 13C is a schematic diagram showing a modification of the refill according to the embodiment.

FIG. 13D is a schematic diagram showing a modification of the refill according to the embodiment.

FIG. 13E is a schematic diagram showing a modification of the refill according to the embodiment.

FIG. 13F is a schematic diagram showing a modification of the refill according to the embodiment.

DESCRIPTION OF EMBODIMENTS

Hereinafter, an embodiment of the present invention will be described with reference to the drawings. The following embodiment is an example for describing the present invention, and the present invention is not limited only to the embodiment.

For convenience, a direction in which a staple sheet accommodated in a refill is discharged is referred to as a forward direction (a positive direction of an X axis in FIGS. 3A to 3D and the like), an opposite direction is referred to as a rearward direction, and the forward direction and the rearward direction may be collectively referred to as a front-rear direction. Further, a direction from a bottom wall of the refill toward an upper lid portion may be referred to as an upward direction (a positive direction of a Z axis in FIGS. 3A to 3D or the like), an opposite direction may be referred to as a downward direction, and the upward direction and the downward direction may be collectively referred to as an upper-lower direction. A right side when viewed from the front may be referred to as a rightward direction (a positive direction of a Y axis in FIGS. 3A to 3D and the like), and an opposite direction may be referred to as a leftward direction. Names in the directions are for convenience showing relative positional relationships and do not indicate absolute directions.

[Configuration of Staple Sheet]

Figure 1A:
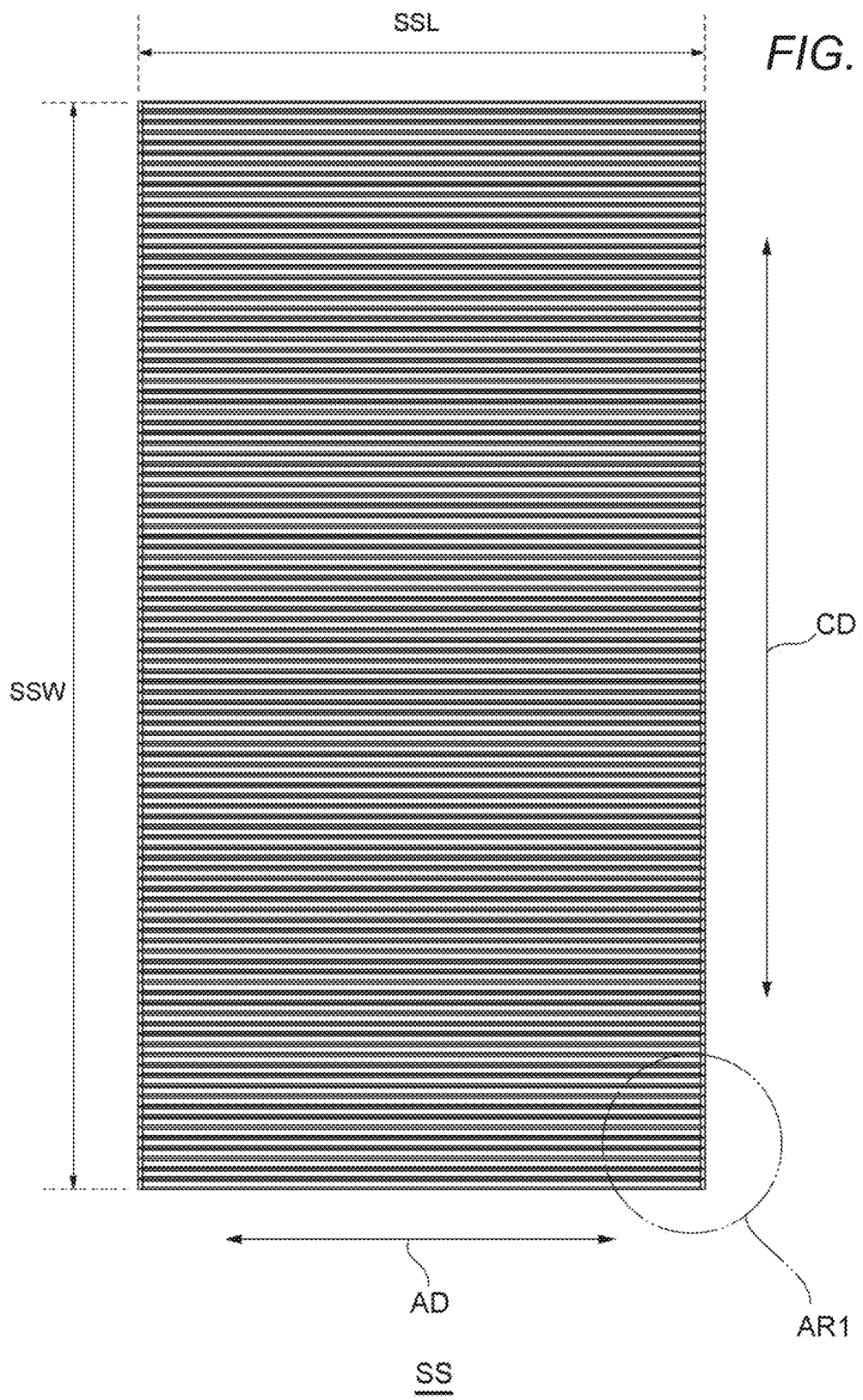
FIG. 1A is a plan view of a staple sheet according to an embodiment.
Figure 1B:
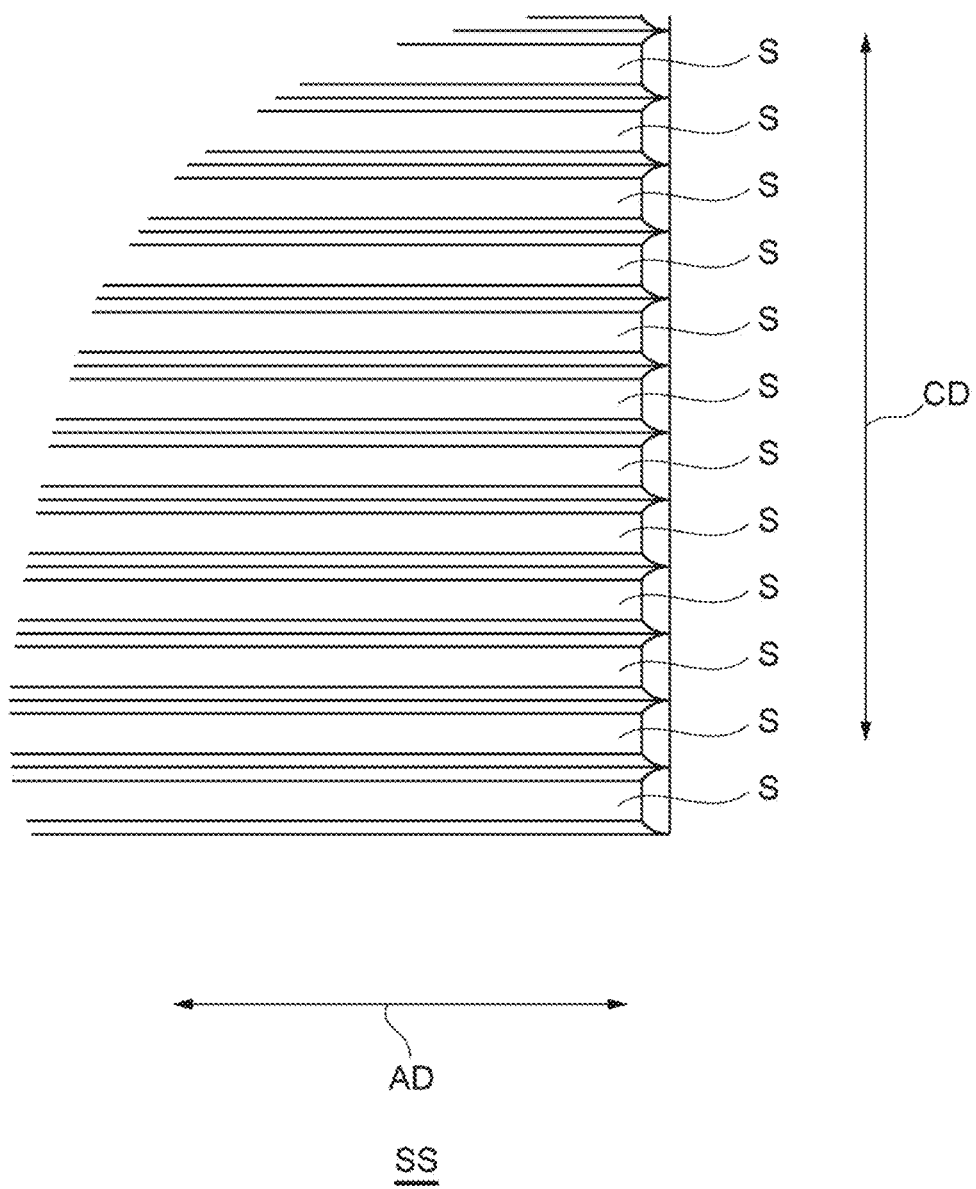
FIG. 1B is a partially enlarged view of the plan view of the staple sheet according to the embodiment.
Figure 2A:
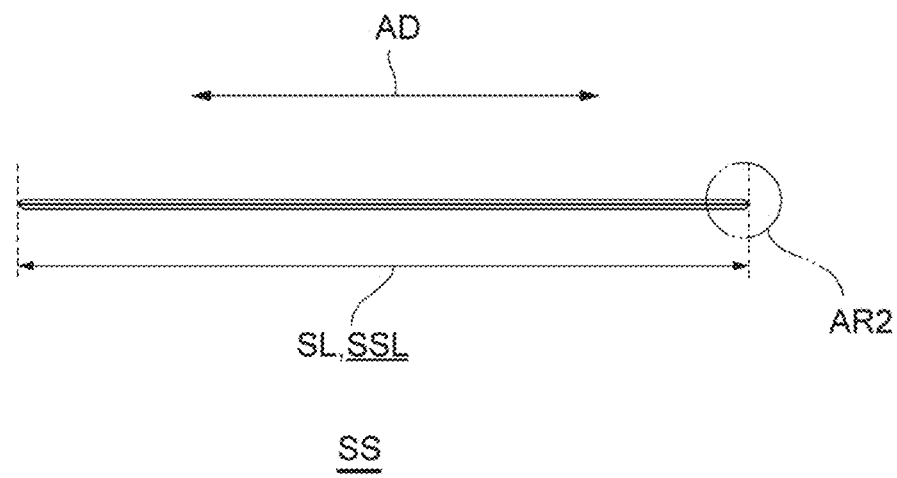
FIG. 2A is a front view of the staple sheet according to the embodiment, which is a front view of the staple sheet as viewed from a front side.
Figure 2B:
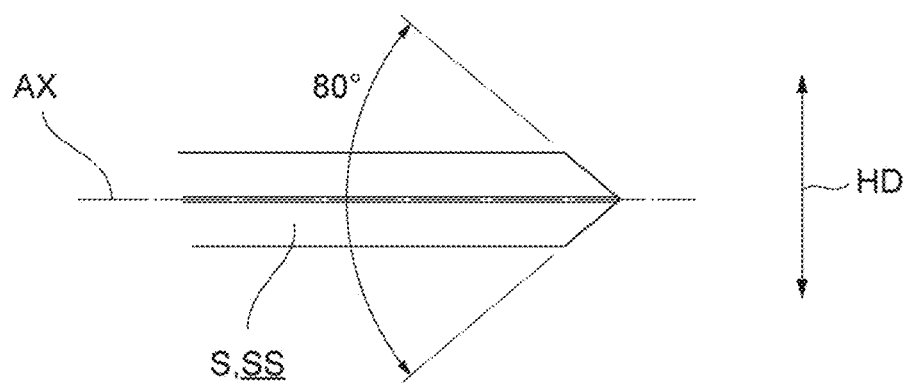
FIG. 2B is a front view of the staple sheet according to the embodiment, which is an enlarged view of an end portion AR2 in FIG. 2A.
Figure 2C:
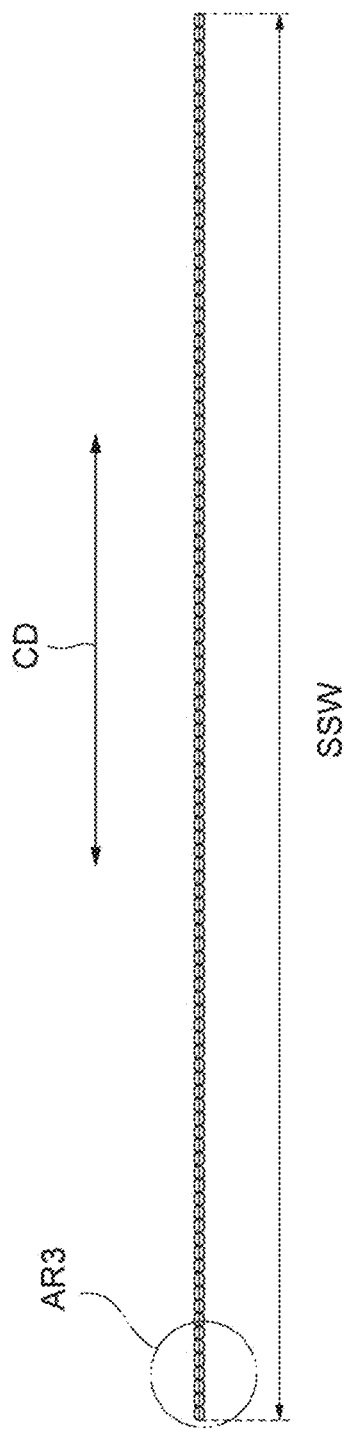
FIG. 2C is a side view of the staple sheet according to the embodiment, which is a right side view of the staple sheet as viewed from a right side.

FIGS. 1A and 1B are a plan view of a staple sheet SS disclosed in the present embodiment as viewed from above and an enlarged view of a corner portion AR1 of the staple sheet SS in the same figure. FIG. 2A is a front view of the staple sheet SS as viewed from the front side and FIG. 2B is an enlarged view of an end portion AR2 of the staple sheet SS in FIG. 2A. FIG. 2C is a right side view of the staple sheet SS as viewed from the right side and FIG. 2D is an enlarged view of a front end portion AR3 of the staple sheet SS in FIG. 2C.

The staple sheet SS as shown in these figures is formed by coupling staples S, all extending in one direction, in a direction orthogonal to the extending direction (hereinafter, the extending direction in which an axis AX of the staple extends is referred to as an "axial direction AD", a direction in which an adjacent staple coupled at a right angle with respect to the axial direction AD is present is referred to as a "coupling direction CD", and a direction orthogonal to the axial direction AD and the coupling direction CD is referred to as a "height direction HD").

As shown in the front view of FIG. 2A and the right side view of FIG. 2C, each of the staples S is formed vertically symmetrically in both a front view and a side view. Further, as shown in FIG. 1B, FIG. 2A, FIG. 2B and the like, each of both end portions of each staple S in the axial direction AD has, at an intermediate position in the height direction HD, a tip end that extends in the coupling direction CD and protrudes in the axial direction AD.

Figure 2D:
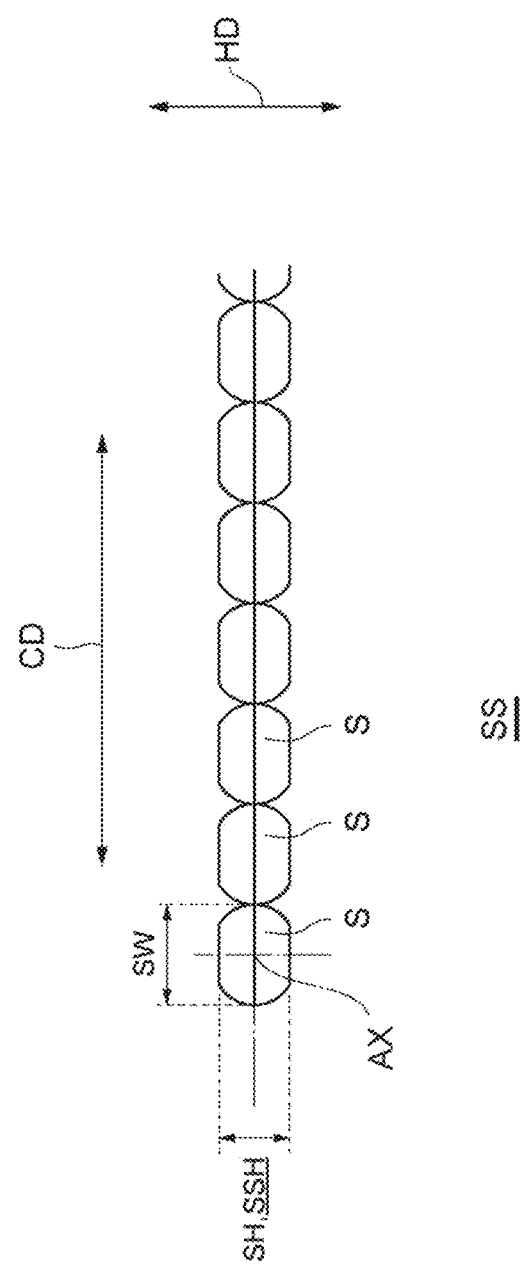
FIG. 2D is a side view of the staple sheet according to the embodiment, which is an enlarged view of a front end portion AR3 in FIG. 2C.

Further, as shown in FIG. 1A, FIG. 2C, FIG. 2D and the like, each staple S is formed such that a width thereof in the coupling direction CD is larger than a height thereof, and has a flat upper surface, a flat lower surface, and two side surfaces each of which connects the upper surface and the lower surface and is inclined such that a width thereof is largest at an intermediate position in the height direction.

A single staple sheet SS includes a plurality of staples S coupled in the coupling direction CD perpendicular to the axial direction AD, and has a rectangular shape having two short sides and two long sides in a plan view. A length SSL of the short side of the staple sheet SS corresponds to a length SL of one staple S in the axial direction (FIG. 2A), and is, for example, 10 mm to 30 mm. A length SSW of the long side of the staple sheet SS corresponds to a value obtained by multiplying a width SW of one staple S in the coupling direction by the number of coupled staples (for example, 100 to 200) (FIG. 2C and FIG. 2D), and is, for example, 30 mm to 50 mm. A thickness SSH of the staple sheet SS corresponds to a height SH of one staple S, and is, for example, 0.1 mm to 1 mm.

In a refill 10, each of the staple sheets SS is placed such that the coupling direction CD coincides with the front-rear direction (X-axis direction) and the axial direction AD coincides with the left-right direction (Y-axis direction), and a plurality of staple sheets SS are stacked in the upper-lower direction (Z-axis direction). Therefore, the upper-lower direction may be referred to as a stacking direction.

[Basic Configuration of Refill]

Figure 3A:
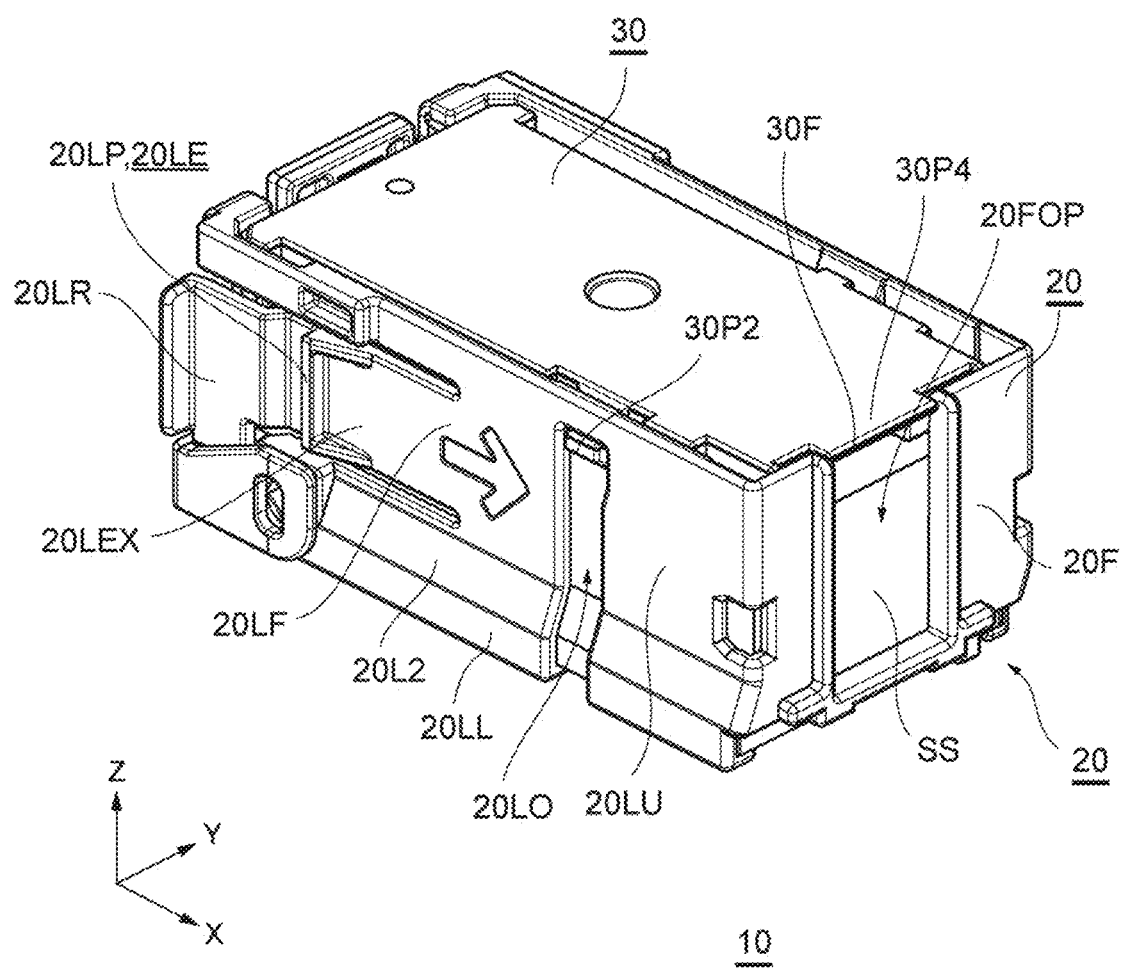
FIG. 3A is a perspective view of a refill according to the embodiment.
Figure 3B:
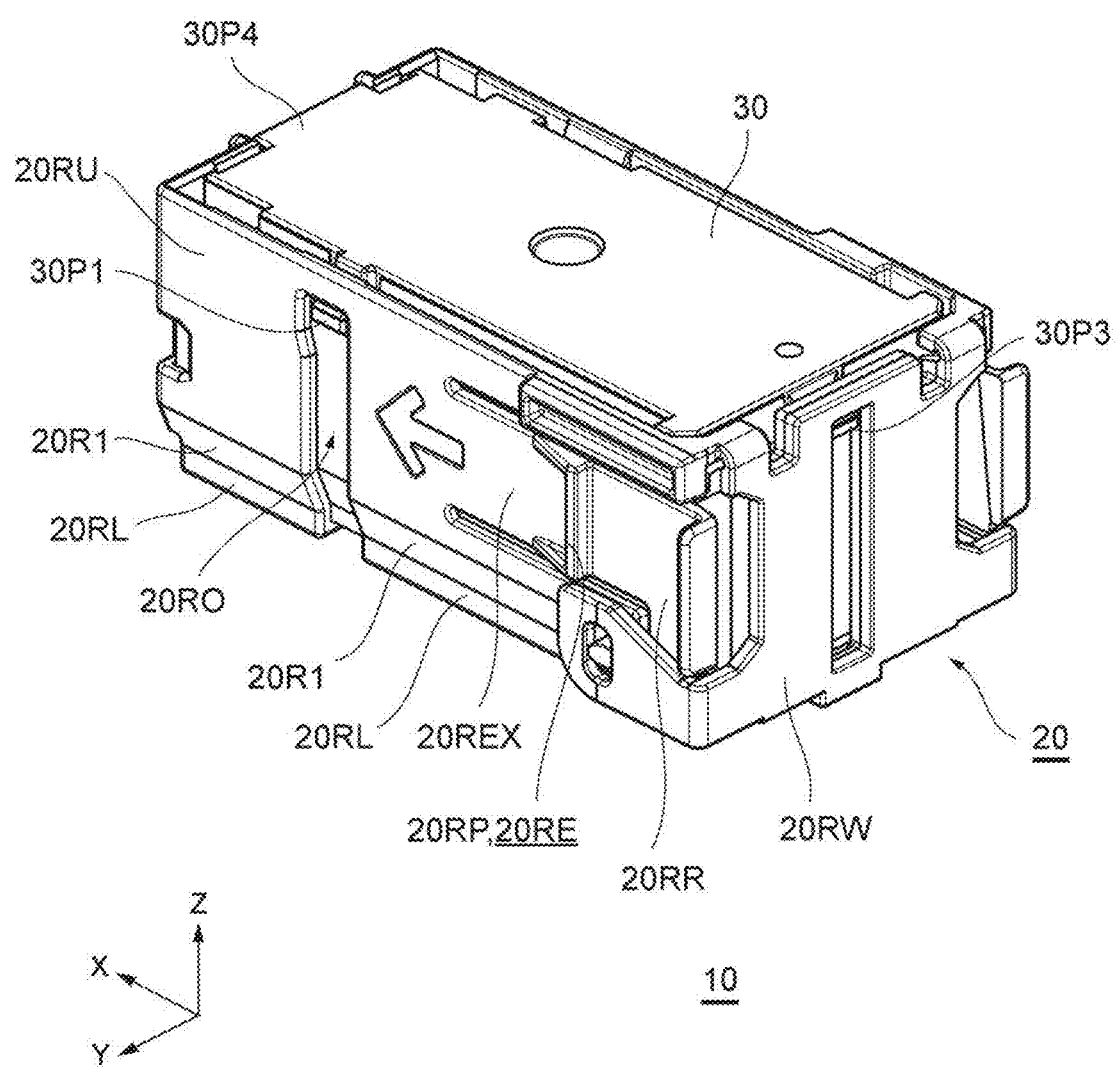
FIG. 3B is a perspective view of the refill according to the embodiment.
Figure 3C:
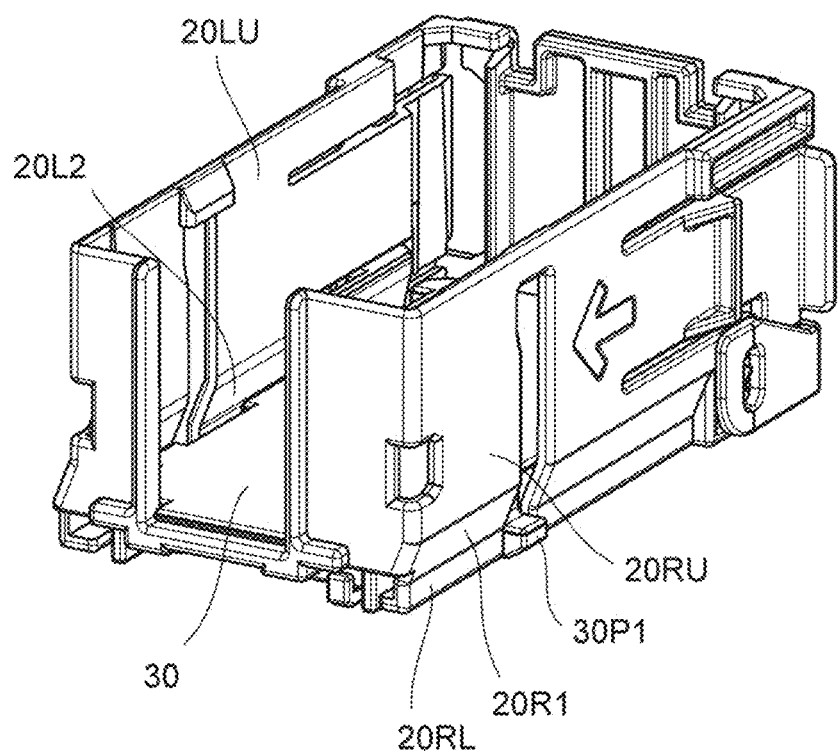
FIG. 3C is a perspective view of the refill according to the embodiment.
Figure 3D:
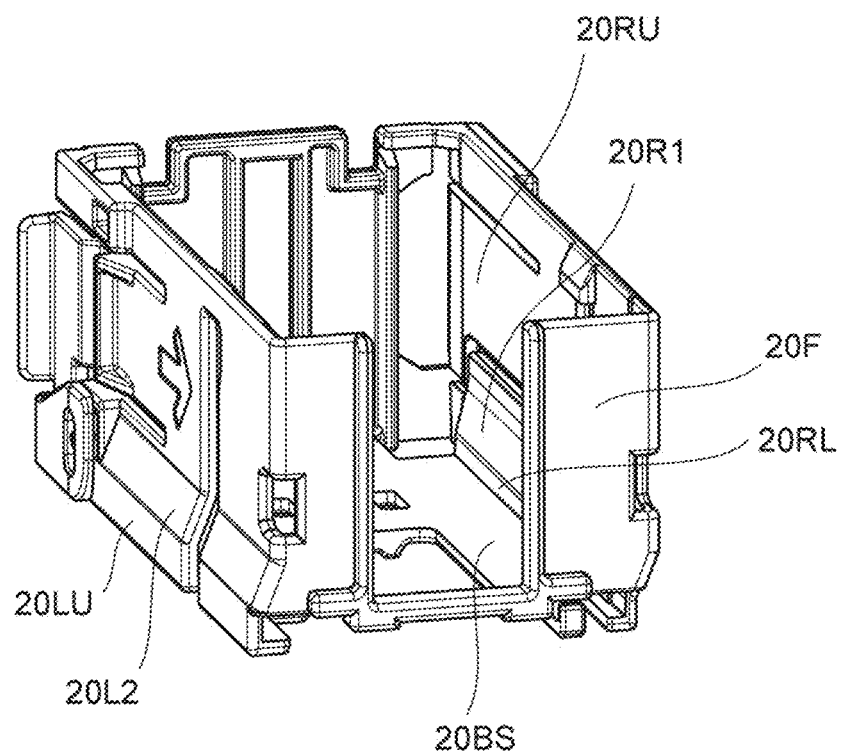
FIG. 3D is a perspective view of the refill according to the embodiment.
Figure 4A:
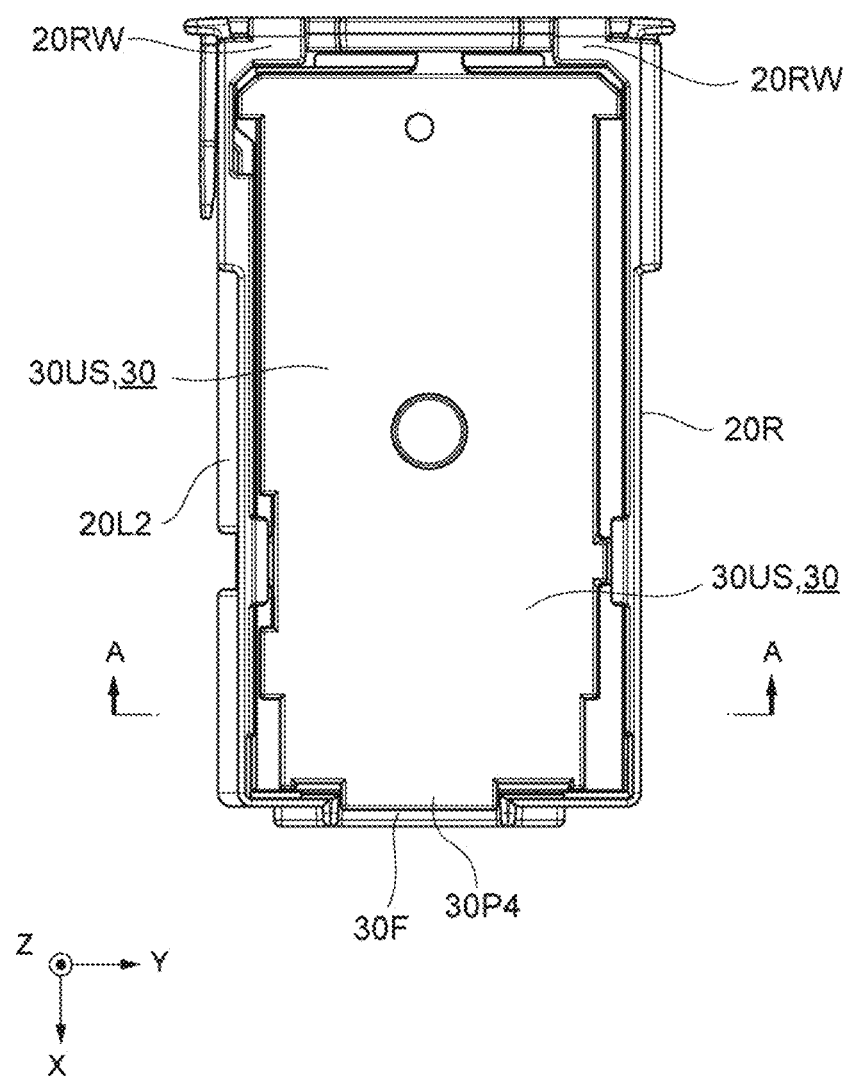
FIG. 4A is a plan view of the refill according to the embodiment.
Figure 4B:
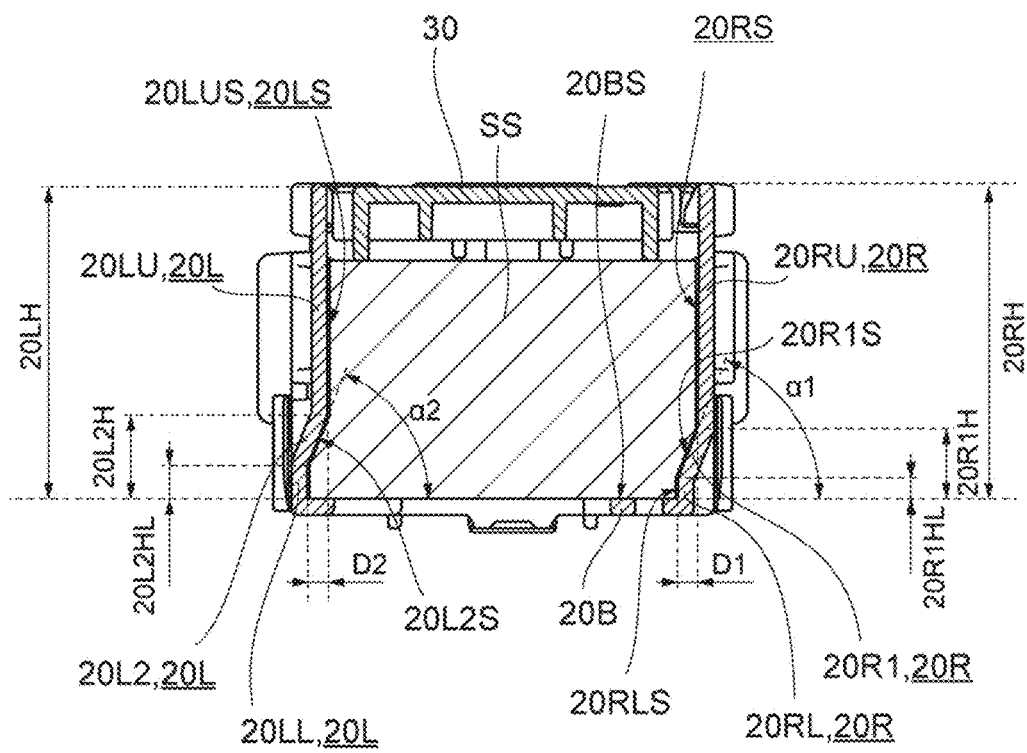
FIG. 4B is a cross-sectional view of the refill according to the embodiment.
Figure 5B:
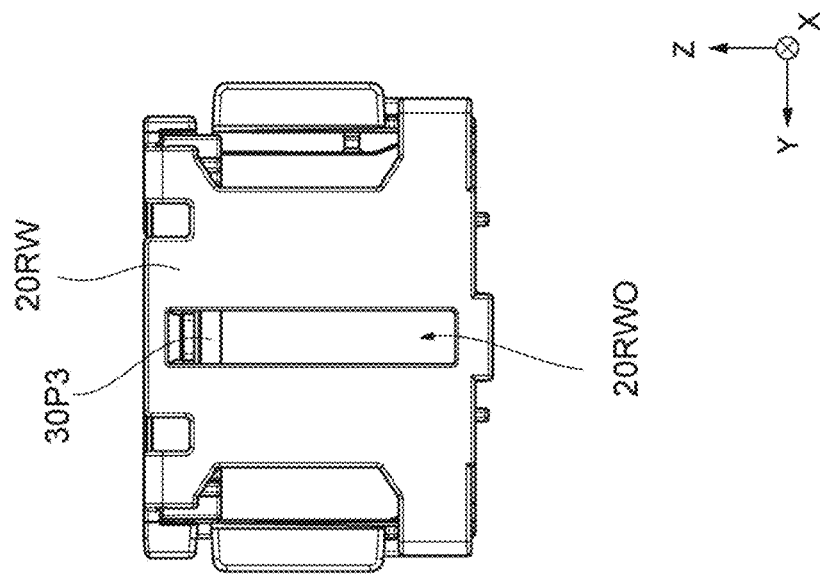
FIG. 5B is a rear view of the refill according to the embodiment.
Figure 5A:
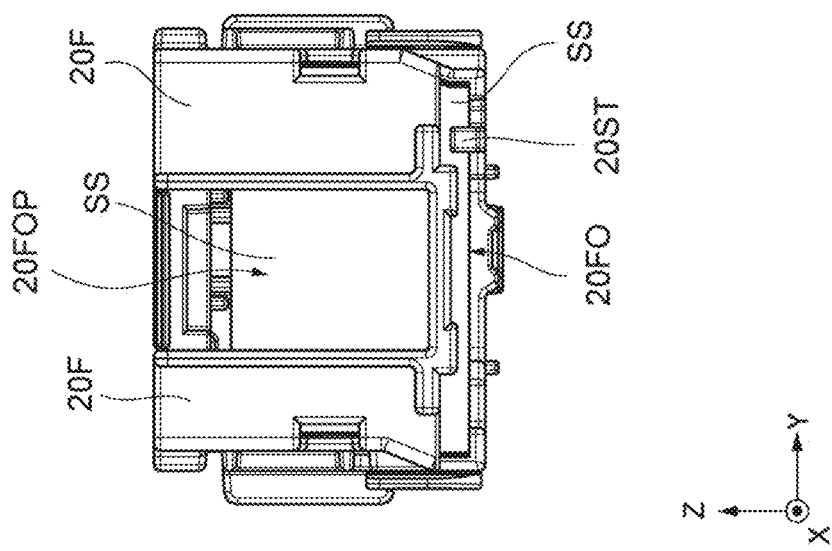
FIG. 5A is a front view of the refill according to the embodiment.
Figure 5C:
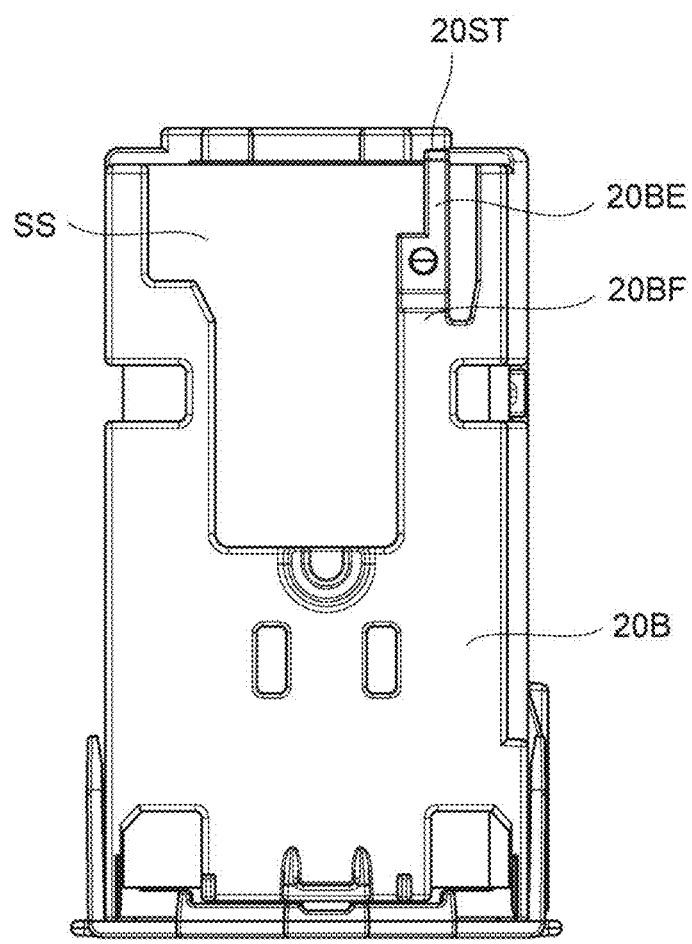
FIG. 5C is a bottom view of the refill according to the embodiment.
Figure 6A:
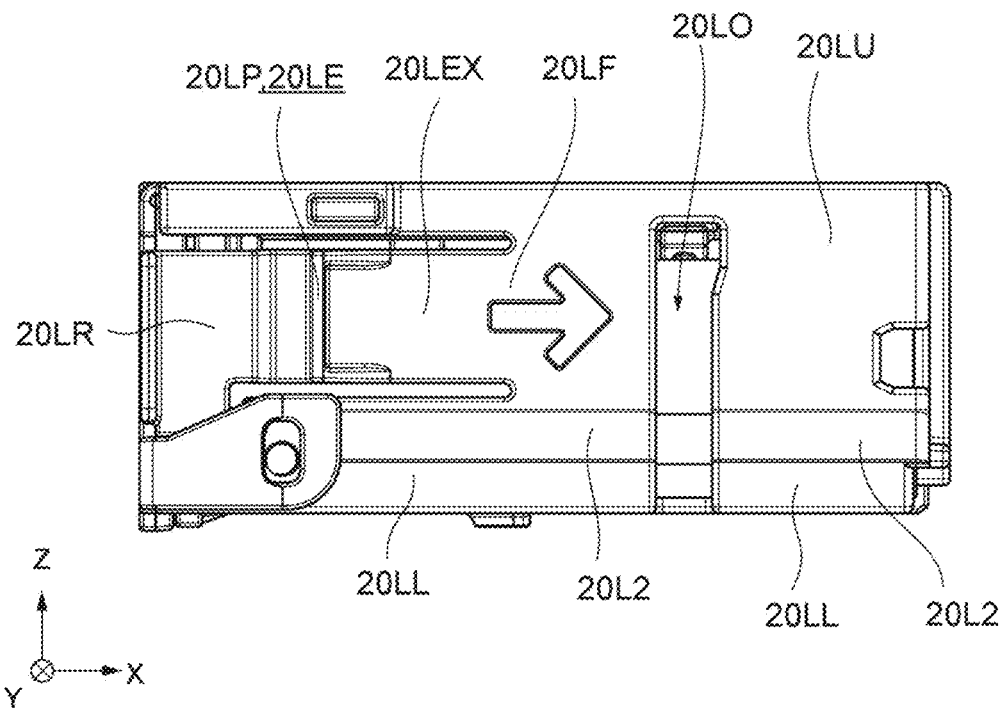
FIG. 6A is a left side view of the refill according to the embodiment.
Figure 6B:
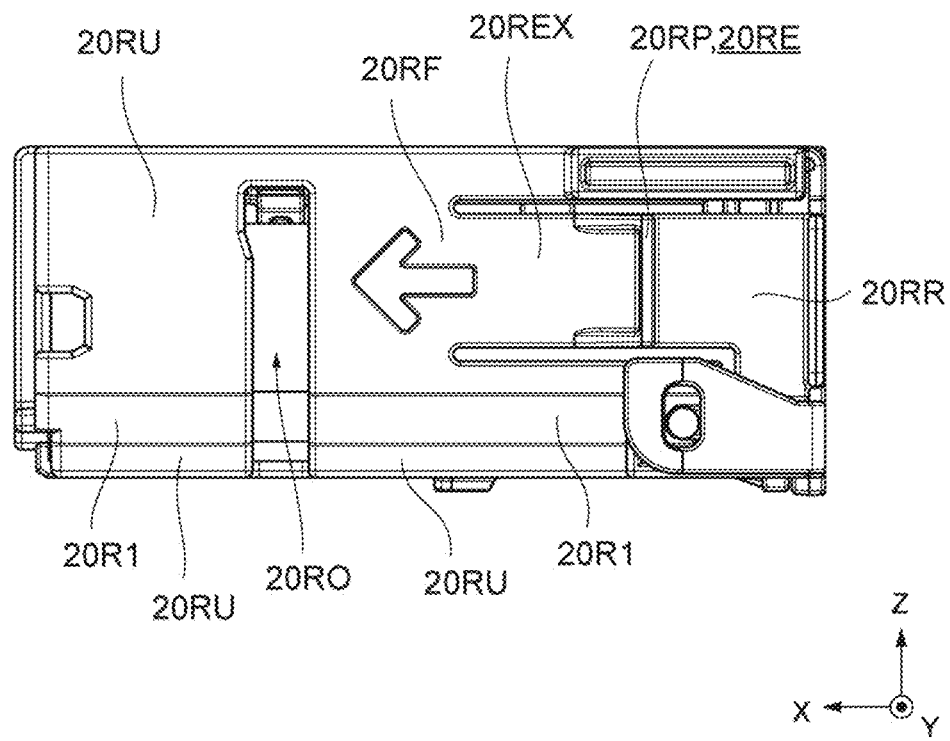
FIG. 6B is a right side view of the refill according to the embodiment.

FIG. 3A is a perspective view of the refill 10 according to the present embodiment as viewed from a front left side, and FIG. 3B is a perspective view of the refill 10 as viewed from a rear right side. FIG. 3C is a perspective view of the refill 10 in which all the staple sheets SS are consumed and no staple sheet SS exists in the refill 10, as viewed from a front right side, and FIG. 3D is a perspective view of the refill 10 in a state where an upper lid portion 30 is detached, as viewed from a front left side. FIGS. 4A and 4B are a plan view of the refill 10 as viewed from above and a cross-sectional view taken along a line A-A in the same figure. FIG. 5A is a front view of the refill 10 as viewed from a front side and FIG. 5B is a rear view of the refill 10 as viewed from a rear side, and FIG. 5C is a bottom view of the refill 10 as viewed from below. FIG. 6A is a left side view of the refill 10 as viewed from a left side and FIG. 6B is a right side view of the refill 10 as viewed from a right side.

The refill 10 as shown in these figures includes a main body portion 20 for accommodating the staple sheets SS in a stacked state, and the upper lid portion 30 which covers the uppermost staple sheet SS accommodated in the main body portion 20 from above.

The main body portion 20 includes five wall portions, that is, a bottom wall 20B, a left side wall 20L, a right side wall 20R, a front wall 20F, and a rear wall 20RW. The staple sheets SS are accommodated in a region surrounded by the five wall portions and the upper lid portion 30. As will be described later, an opening may be formed in each of the wall portions. The wall portions may be formed separately or integrally. For example, the bottom wall 20B and the left side wall 20L (or the right side wall 20R) may be formed by bonding different members using a means such as an adhesive, or may be formed by using other means such as integral molding. Further, each of the wall portions may include one or a plurality of components. For example, the front wall 20F and the bottom wall 20B may be made of an integrally molded resin.

The bottom wall 20B (FIG. 5C) is a wall portion on which one or a plurality of staple sheets SS are stacked and placed, and has a bottom surface 20BS (FIG. 3D) with which the lowermost staple sheet SS are in contact. Therefore, the bottom surface 20BS of the bottom wall 20B is formed such that the staple sheet SS can be placed thereon. Since the staple sheet SS of the present embodiment is formed in a rectangular shape having long sides and short sides as described above, the bottom surface 20BS of the bottom wall 20B is formed in a substantially rectangular shape having a front end, a rear end, a left end, and a right end in a plan view. As shown in FIG. 5A, FIG. 5B and FIG. 5C, in the bottom wall 20B, a plurality of openings including an opening in communication with the front end and extending rearward are formed. A feeding means (for example, a claw or a roller) provided in an electric stapler SP is engaged with the lowermost staple sheet SS, that is exposed due to the opening, from below and applies a force toward the forward direction, and thus the lowermost staple sheet SS can be moved forward.

Further, the bottom wall 20B according to the present embodiment is additionally provided with a front end portion 20ST (sometimes referred to as a "staple sheet stopper 20ST"), which is located in front of an opening 20FO for discharging the staple sheet SS forward in a state where the refill is not attached to a cartridge C, to restrict the forward movement of the staple sheet SS, that is, the discharge of the staple sheet SS from the opening 20FO, and is retracted downward in a state where the refill is attached to the cartridge C, to allow the forward movement of the staple sheet SS. A configuration of the front end portion 20ST will be described later.

The right side wall 20R (an example of a "first side wall" in FIG. 6A and FIG. 6B) is a wall portion provided at a position facing one end portion of the staple sheet SS in the axial direction AD, and is formed to be erected in the upward direction (stacking direction) from a right end portion of the bottom wall 20B. The right side wall 20R has an inner wall surface 20RS (FIG. 4B) facing one end portion of each of the stacked staple sheets SS in the axial direction AD when the staple sheets SS are stacked and placed on the bottom wall 20B. In other words, the inner wall surface 20RS of the right side wall 20R faces an inner wall surface 20LS of the left side wall 20L with the staple sheet SS interposed therebetween.

As shown in the cross-sectional view of FIG. 4B, the right side wall 20R has, in a part thereof in the stacking direction, a first inclined wall 20R1 that is inclined in the axial direction AD. In the present embodiment, the first inclined wall 20R1 of the right side wall 20R is inclined in a direction (rightward direction) away from the left side wall 20L as being away from the bottom wall 20B (as advancing upward). In other words, the first inclined wall 20R1 is inclined in a direction (leftward direction) approaching the left side wall 20L as approaching the bottom wall 20B (as advancing downward). Further, the first inclined wall 20R1 extends in the front-rear direction (coupling direction) (FIG. 3B).

The right side wall 20R further includes, in other parts thereof in the stacking direction, wall portions extending in the stacking direction. In the present embodiment, the right side wall 20R includes, as the wall portions extending in the stacking direction, a right lower side wall 20RL (an example of a "first lower side wall") provided below the first inclined wall 20R1 and connected to the bottom wall 20B, and a right upper side wall 20RU (an example of a "first upper side wall") provided above the first inclined wall 20R1. Therefore, the right side wall 20R includes the right lower side wall 20RL, the first inclined wall 20R1, and the right upper side wall 20RU from below. In the present embodiment, the right lower side wall 20RL and the right upper side wall 20RU are provided perpendicular or substantially perpendicular to the bottom surface 20BS of the bottom wall 20B.

In the right side wall 20R, an opening 20RO formed to extend in the upper-lower direction across a part of the right upper side wall 20RU, the first inclined wall 20R1, and the right lower side wall 20RL, and in communication with the bottom wall 20B is formed. As will be described later, by inserting a first lid projection portion 30P1 of the upper lid portion 30 into the opening 20RO, downward movement of the upper lid portion 30 as the staple sheet SS is consumed can be guided. In addition, as will be described later, the first lid projection portion 30P1 is configured to protrude from the opening 20RO formed in the first inclined wall 20R1. Meanwhile, the cartridge C into which the refill 10 is inserted includes a stopper CS for the refill (FIG. 10B) that restricts rearward movement of the first lid projection portion 30P1 protruding from the first inclined wall 20R1.

According to such a configuration, the refill 10 can be prevented from being detached from the cartridge C.

Further, the right side wall 20R includes a cartridge engagement right wall portion 20RE which is engaged with the cartridge to prohibit separation from the cartridge in a state where the staple sheets SS remain in the refill 10, and allows the separation from the cartridge in a state where no staple sheet SS exists in the refill 10. A configuration of the cartridge engagement right wall portion 20RE will be described later.

If the first inclined wall 20R1 inclined in the axial direction AD is provided in the part in the stacking direction, the right lower side wall 20RL may not be provided. In this case, the right side wall 20R includes the first inclined wall 20R1 connected to the bottom wall 20B and the right upper side wall 20RU provided above the first inclined wall 20R1.

The first inclined wall 20R1 is not necessarily formed from the front wall 20F to the rear wall 20RW, and may be provided in a partial region between the front wall 20F and the rear wall 20RW. When the first inclined wall 20R1 is provided in the partial region, a position of the staple sheet SS can be restricted by contact of the first inclined wall 20R1 with the staple sheet SS.

The right side wall 20R is not necessarily connected to the bottom wall 20B from the front wall 20F to the rear wall 20RW. For example, an opening may be formed at a boundary between the bottom wall 20B and the right side wall 20R, and the bottom wall 20B and the right side wall 20R may be formed such that the bottom wall 20B and the right side wall 20R are connected only in a partial region.

A preferable configuration regarding a height at which the first inclined wall 20R1 is provided, an inclination angle of the first inclined wall 20R1, a displacement amount between the upper side wall and the lower side wall, and the like will be described later.

The left side wall 20L (an example of a "second side wall" in FIG. 6A and FIG. 6B) is a wall portion provided at a position facing the other end portion of the staple sheet SS in the axial direction AD, and is formed to be erected in the upward direction (stacking direction) from a left end portion of the bottom wall 20B. The left side wall 20L has the inner wall surface 20LS (FIG. 4B) facing the other end portion of each of the stacked staple sheets SS in the axial direction AD when the staple sheets SS are stacked and placed on the bottom wall 20B. In other words, the inner wall surface 20LS of the left side wall 20L faces the inner wall surface 20RS of the right side wall 20R with the staple sheet SS interposed therebetween.

As shown in the cross-sectional view of FIG. 4B, the left side wall 20L has, in a part thereof in the stacking direction, a second inclined wall 20L2 that is inclined in the axial direction AD. In the present embodiment, the second inclined wall 20L2 of the left side wall 20L is inclined in a direction (rightward direction) approaching the right side wall 20R as being away from the bottom wall 20B (as advancing upward). In other words, the second inclined wall 20L2 is inclined in a direction (leftward direction) away from the right side wall 20R as the second inclined wall 20L2 approaches the bottom wall 20B (as advancing downward). As shown in FIG. 3A, the second inclined wall 20L2 extends in the front-rear direction (coupling direction CD).

The left side wall 20L further includes, in other parts thereof in the stacking direction, wall portions extending in the stacking direction. In the present embodiment, the left side wall 20L includes, as the wall portions extending in the stacking direction, a left lower side wall 20LL (an example of a "second lower side wall") provided below the second inclined wall 20L2 and connected to the bottom wall 20B, and a left upper side wall 20LU (an example of a "second upper side wall") provided above the second inclined wall 20L2. Therefore, the left side wall 20L includes the left lower side wall 20LL, the second inclined wall 20L2, and the left upper side wall 20LU from below. In the present embodiment, the left lower side wall 20LL and the left upper side wall 20LU are provided perpendicular or substantially perpendicular to the bottom surface 20BS of the bottom wall 20B.

In the left side wall 20L, an opening 20LO formed to extend in the upper-lower direction across a part of the left upper side wall 20LU, the second inclined wall 20L2, and the left lower side wall 20LL, and in communication with the bottom wall 20B is formed. As will be described later, by inserting a second lid projection portion 30P2 of the upper lid portion 30 into the opening 20LO, downward movement of the upper lid portion 30 as the staple sheet SS is consumed can be guided.

Further, the left side wall 20L includes a cartridge engagement left wall portion 20LE which is engaged with the cartridge C to prohibit separation from the cartridge C in a state where the staple sheets SS remain in the refill 10, and allows the separation from the cartridge C in a state where no staple sheet SS exists in the refill 10. A configuration of the cartridge engagement left wall portion 20LE will be described later.

If the second inclined wall 20L2 inclined in the axial direction AD is provided in the part in the stacking direction, the left lower side wall 20LL may not be provided. In this case, the left side wall 20L includes the second inclined wall 20L2 connected to the bottom wall 20B and the left upper side wall 20LU provided above the second inclined wall 20L2.

The second inclined wall 20L2 is not necessarily formed from the front wall 20F to the rear wall 20RW, and may be provided in a partial region between the front wall 20F and the rear wall 20RW.

The left side wall 20L is not necessarily connected to the bottom wall 20B from the front wall 20F to the rear wall 20RW. For example, an opening may be formed at a boundary between the bottom wall 20B and the left side wall 20L, and the bottom wall 20B and the left side wall 20L may be formed such that the bottom wall 20B and the left side wall 20L are connected only in a partial region.

A height at which the second inclined wall 20L2 is provided, an inclination angle of the second inclined wall 20L2, a length of the second inclined wall 20L2, and the like will be described later.

As described above, as shown in FIG. 4B and the like, the first inclined wall 20R1 and the second inclined wall 20L2 are inclined in the same direction. Therefore, an interval equal to or longer than the length SSL of the short side of the staple sheet SS can be provided between the inner wall surface 20R1S of the first inclined wall 20R1 and the inner wall surface 20L2S of the second inclined wall 20L2.

However, as will be described later, the inclination angle of the first inclined wall 20R1 and the inclination angle of the second inclined wall 20L2 may not be the same. In contrast, the inclination angle of the first inclined wall 20R1 may be the same or substantially the same as the inclination angle of the second inclined wall 20L2. In addition, the position at which the first inclined wall 20R1 is provided (a height from the bottom surface 20BS of the bottom wall 20B) and the position at which the second inclined wall 20L2 is provided (a height from the bottom surface 20BS of the bottom wall 20B) may not be the same. However, at least a part of the first inclined wall 20R1 and at least a part of the second inclined wall 20L2 are formed at the same height from the bottom surface 20BS of the bottom wall 20B. That is, at least the part of the first inclined wall 20R1 and at least the part of the second inclined wall 20L2 face each other in the axial direction. Further, the length of the first inclined wall 20R1 and the length of the second inclined wall 20L2 may not be the same. In contrast, the length of the first inclined wall 20R1 may be the same or substantially the same as the length of the second inclined wall 20L2.

The front wall 20F is provided above a front end portion of the bottom wall 20B. Therefore, the front wall 20F has an inner wall surface that faces a front-facing side surface of each of the staples S located most forward in the stacked staple sheets SS.

In the front wall 20F, an opening 20FO (sometimes referred to as a "discharge opening 20FO") for discharging the staple sheet SS, that is located lowermost among the stacked staple sheets SS and in contact with the bottom surface 20BS of the bottom wall 20B, in a forward direction (coupling direction of the staple sheet SS) is formed. Therefore, the opening 20FO has a length in the left-right direction larger than the length SSL that is the length of the staple sheet SS in the axial direction AD, and has a height in the upper-lower direction larger than the thickness SSH of the staple sheet SS. It is sufficient that the opening 20FO is formed to be able to discharge the staple sheet SS in the forward direction (coupling direction of the staple sheet SS), and therefore, it is sufficient that no wall portion is formed in a region in front of the staple sheet SS to be discharged. For example, the opening 20FO may be formed to surround an entire periphery of the front wall 20F. Alternatively, the opening 20FO may be formed by recessing a part or all of a lower end portion of the front wall 20F upward.

As described above, the refill 10 according to the present embodiment includes the front end portion 20ST which functions as a stopper of the staple sheet SS by being located in front of the opening 20FO in a state where the refill 10 is not attached to the cartridge C. Therefore, in a front view (FIG. 5A) of the refill 10 which is not attached to the cartridge C, a part of the opening 20FO is closed by the front end portion 20ST before extending upward from the bottom wall 20B.

In the front wall 20F, an opening 20FOP extending in the upper-lower direction and in communication with an upper end of the front wall 20F is formed. By forming such an opening 20FOP, the refill 10 can be pulled out rearward and separated from the cartridge C such that an urging member CSP of the cartridge C which presses the upper lid portion 30 of the refill 10 downward passes through the opening. Further, by inserting a fourth lid projection portion 30P4 of the upper lid portion 30 into the opening 20FOP, the downward movement of the upper lid portion 30 as the staple sheet SS is consumed can be guided.

In the present embodiment, a left end portion of the front wall 20F is coupled to a front end portion (front end portion in the coupling direction) of the left side wall 20L, and a right end portion of the front wall 20F is coupled to a front end portion (front end portion in the coupling direction) of the right side wall 20R. In the present embodiment, the front end portion (front end portion in the coupling direction) of the left side wall 20L and the front end portion (front end portion in the coupling direction) of the right side wall 20R are coupled to each other via the front wall 20F. However, it is not necessary to couple the front end portion (front end portion in the coupling direction) of the left side wall 20L and the front end portion (front end portion in the coupling direction) of the right side wall 20R, and the front end portion (front end portion in the coupling direction) of the left side wall 20L and the front end portion (front end portion in the coupling direction) of the right side wall 20R may not be coupled to each other. Further, in the present embodiment, the front wall 20F is provided perpendicular to the bottom wall 20B, and therefore the inner wall surface of the front wall 20F is formed perpendicular to the bottom surface 20BS of the bottom wall 20B. However, the front wall 20F or the inner wall surface of the front wall 20F may be formed to be inclined with respect to the bottom surface 20BS of the bottom wall 20B, for example, may be inclined to advance rearward as advancing upward away from the bottom surface 20BS, or may be inclined to advance forward as advancing upward away from the bottom surface 20BS.

The rear wall 20RW is provided above a rear end portion of the bottom wall 20B. Therefore, the rear wall 20RW has an inner wall surface that faces a rear-facing side surface of each of the staples S located most rearward in the stacked staple sheets SS.

In the rear wall 20RW, an opening 20RWO extending in the upper-lower direction is formed. By inserting a third lid projection portion 30P3 of the upper lid portion 30 into the opening 20RWO, the downward movement of the upper lid portion 30 as the staple sheet SS is consumed can be guided while preventing the upper lid portion 30 from being detached from the refill 10.

The upper lid portion 30 (FIG. 4A) is a plate-shaped wall portion that is formed in a rectangular shape in a plan view and covers an upper surface of one or a plurality of staple sheets SS placed on the bottom wall 20B, and has an inner wall surface facing the upper surface of the uppermost staple sheet SS.

The upper lid portion 30 has an upper surface 30US that is pressed downward by the urging member CSP of the cartridge C. Since the upper lid portion 30 is urged downward, the inner wall surface of the upper lid portion 30 comes into contact with the upper surface of the uppermost staple sheet SS and presses the staple sheet SS downward. Such a configuration allows the staple sheet SS to be maintained parallel to the bottom surface 20BS of the bottom wall 20B.

Here, the upper lid portion 30 includes, at a center portion in the left-right direction, the fourth lid projection portion 30P4 that protrudes forward. The fourth lid projection portion 30P4 protrudes forward than a front end of the staple sheet SS. By providing such a fourth lid projection portion 30P4, as will be described later, the urging member CSP of the cartridge C is in contact with only the upper surface 30US of the upper lid portion 30 from when the refill 10 is attached to the cartridge C to when the staple sheets SS are consumed and the refill 10 is separated from the cartridge C. Therefore, by forming the upper surface 30US of the upper lid portion 30 to be smooth, the urging member CSP of the cartridge C can be prevented from being caught by the refill 10. Meanwhile, a small gap (play) is provided between a rear end of the upper lid portion 30 and the rear wall 20RW.

The upper lid portion 30 is provided to be movable downward as the staple sheet SS is consumed. FIG. 3C is a perspective view of the refill 10 in which all of the staple sheets SS are consumed, as viewed from a front right side. As shown in the figure, the upper lid portion 30 is provided to be movable downward to a position in contact with the bottom surface 20BS of the bottom wall 20B. In order to guide the downward movement, the upper lid portion 30 includes the first lid projection portion 30P1 (FIG. 3B) protruding outward (rightward) from a right side portion (right end) of the upper lid portion 30 and engaging with the opening 20RO extending vertically in the right side wall 20R; the second lid projection portion 30P2 (FIG. 3A) protruding outward (leftward) from a left side portion (left end) of the upper lid portion 30 and engaging with the opening 20LO extending vertically in the left side wall 20L; and the third lid projection portion 30P3 (FIG. 3B) protruding outward (rearward) from the rear end portion (rear end) of the upper lid portion 30 and engaging with the opening 20RWO extending vertically in the rear wall 20RW. Further, as described above, the upper lid portion 30 includes the fourth lid projection portion 30P4 protruding outward (forward) from the front end portion (front end) of the upper lid portion 30 and engaging with the opening 20FOP extending vertically in the front wall 20F. In this way, the upper lid portion 30 includes four projection portions protruding in four directions and engaging with the four wall portions of the main body portion, and thus can move downward while maintaining parallelism.

As shown in FIGS. 4A and 4B, a width of the upper lid portion 30 in the left-right direction excluding the first lid projection portion 30P1 and the second lid projection portion 30P2 is smaller than an interval between an inner wall surface 20LUS of the left upper side wall 20LU and an inner wall surface 20RLS of the right lower side wall 20RL in the left-right direction. With such a configuration, even when the upper lid portion 30 descends and is caught on the first inclined wall 20R1, the upper lid portion 30 can advance straight downward.

Figure 7A:
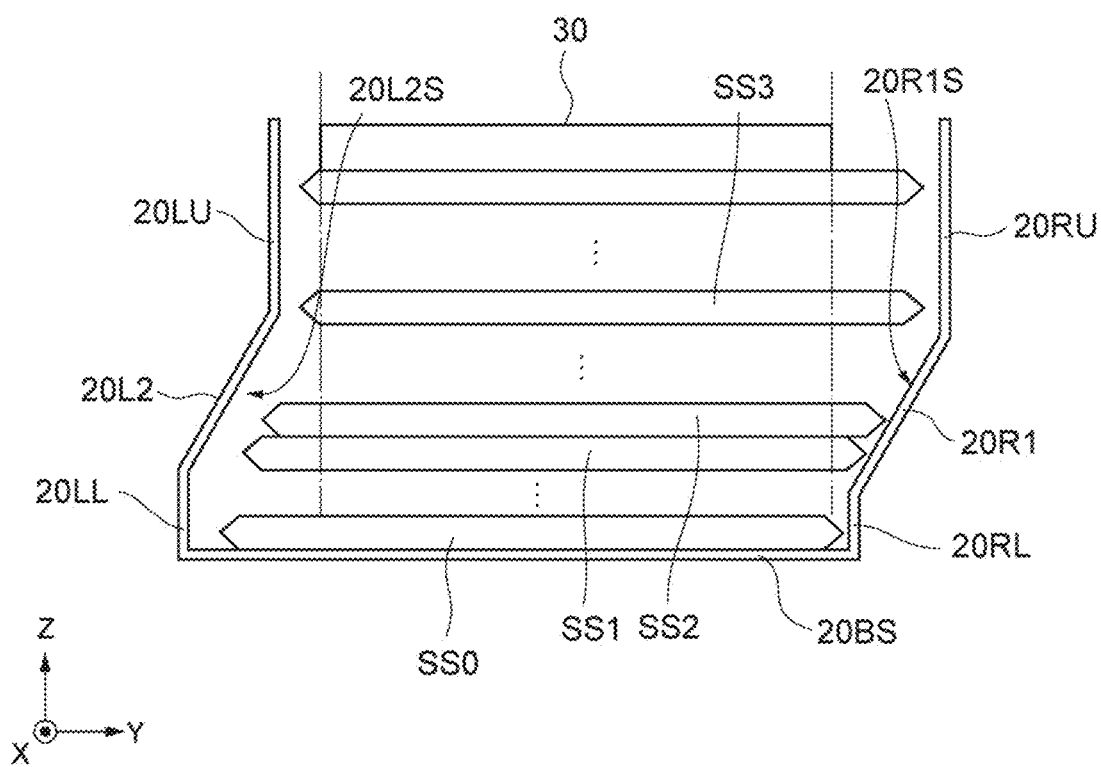
FIG. 7A is a schematic diagram showing a cross section of the refill according to one embodiment.

Effects of the refill 10 having the above-described basic configuration will be described below. FIG. 7A is a diagram illustrating the effects of the refill 10 having the basic configuration, and is a schematic diagram in which the refill 10 is cut by a virtual plane perpendicular to the coupling direction (the front-rear direction) in the staple sheet SS. For the sake of convenience of description, dimensions of each configuration are different from those in other drawings.

As shown in the figure, in the present embodiment, the staple sheets SS stacked and placed on the bottom wall 20B of the refill 10 are disposed between the left side wall 20L and the right side wall 20R. Here, regardless of a height from the bottom surface 20BS of the bottom wall 20B, the interval between the left side wall 20L and the right side wall 20R in the axial direction AD is slightly larger than the length SSL of the short side of the staple sheet SS. Therefore, a small gap is provided at least between the inner wall surface of the left side wall 20L and the staple sheet SS or between the inner wall surface of the right side wall 20R and the staple sheet SS. When the lowermost staple sheet SS is discharged, each of the staple sheets SS moves downward by the thickness of the staple sheet SS.

The refill 10 according to the present embodiment includes the second inclined wall 20L2 and the first inclined wall 20R1. Therefore, when the staple sheet SS located between the left upper side wall 20LU and the right upper side wall 20RU moves downward to a position facing the first inclined wall 20R1, the staple sheet SS comes into contact with the inner wall surface 20R1S of the first inclined wall 20R1 and is displaced slightly in the axial direction (a direction approaching the left side wall 20L which is the second side wall). Therefore, at least a part of an axial end portion of one or a plurality of staple sheets SS facing the first inclined wall 20R1 among the staple sheets SS in the refill 10 (an axial end portion of one or a plurality of staples S constituting the staple sheet SS) comes into contact with the inner wall surface 20R1S of the first inclined wall 20R1, or is closer to the inner wall surface 20R1S than to the inner wall surface 20L2S of the second inclined wall 20L2.

As a result of such a configuration, the staple sheets SS (a part of the staple sheets SS) stacked in the refill 10 are displaced in the axial direction AD according to the height. For example, a staple sheet SS1 located above a lowermost staple sheet SS0 is displaced in the axial direction AD with respect to the staple sheet SS0. Here, the staple sheet SS1 may be located between the second inclined wall 20L2 and the first inclined wall 20R1 in the cross-sectional view. Further, at least a part of an axial end portion of the staple sheet SS1 (an axial end portion of one or a plurality of staples S constituting the staple sheet SS1) comes into contact with the inner wall surface 20R1S of the first inclined wall 20R1, or is closer to the inner wall surface 20R1S than to the inner wall surface 20L2S of the second inclined wall 20L2.

Further, a staple sheet SS2 on an upper layer of the staple sheet SS1 is further displaced in the axial direction AD with respect to the staple sheet SS1. Here, the staple sheet SS2 may be located between the second inclined wall 20L2 and the first inclined wall 20R1 in the cross-sectional view. Further, at least a part of an axial end portion of the staple sheet SS2 (an axial end portion of one or a plurality of staples S constituting the staple sheet SS2) comes into contact with the inner wall surface 20R1S of the first inclined wall 20R1, or is closer to the inner wall surface 20R1S than to the inner wall surface 20L2S of the second inclined wall 20L2.

Further, a staple sheet SS3 on an upper layer of the staple sheet SS2 is placed at a position displaced in the axial direction AD on any one of the staple sheet SS0, the staple sheet SS1 and the staple sheet SS2. Here, the staple sheet SS2 may be located between the left upper side wall 20LU and the right upper side wall 20RU in the cross-sectional view. At this time, a displacement amount of the staple sheet SS3 with respect to the staple sheet SS1 is larger than a displacement amount of the staple sheet SS3 with respect to the staple sheet SS2, and a displacement amount of the staple sheet SS3 with respect to the staple sheet SS0 is larger than a displacement amount of the staple sheet SS3 with respect to the staple sheet SS1.

According to the refill 10 having the basic configuration described above, the staple sheet SS in the refill 10 can be displaced (shifted) in the axial direction AD according to the height from the bottom surface of the bottom wall 20B, so that blocking in which the upper and lower staple sheets SS stick together in the refill 10 can be prevented.

Here, a protective film may be formed on a surface of the staple sheet SS by applying lubricating oil or the like for the purpose of preventing scratches or the like. When such a staple sheet SS is pressed by the staple sheet SS stacked above in the refill 10, the protective films of the upper and lower staple sheets SS are brought into close contact with each other, making blocking even more likely to occur. In such staple sheets SS, according to the refill 10, the staple sheets SS in the refill 10 can be displaced (shifted) in the axial direction AD according to the height from the bottom surface of the bottom wall 20B, so that the blocking can also be prevented.

In the refill 10 according to the present embodiment, a part of the stacked staple sheets SS is displaced (shifted) in the axial direction AD due to the first inclined wall 20R1 and/or the second inclined wall 20L2, thereby preventing adhesion between the upper and lower staple sheets SS. On the other hand, for example, as shown in (A) and (B) of FIG.

7B, a configuration (hereinafter, may be referred to as a "comparative configuration") in which the blocking is prevented by inclining the front wall of the refill and displacing the stacked staple sheets forward may be considered. However, when this configuration is adopted, the following problems may occur.

Figure 7B:
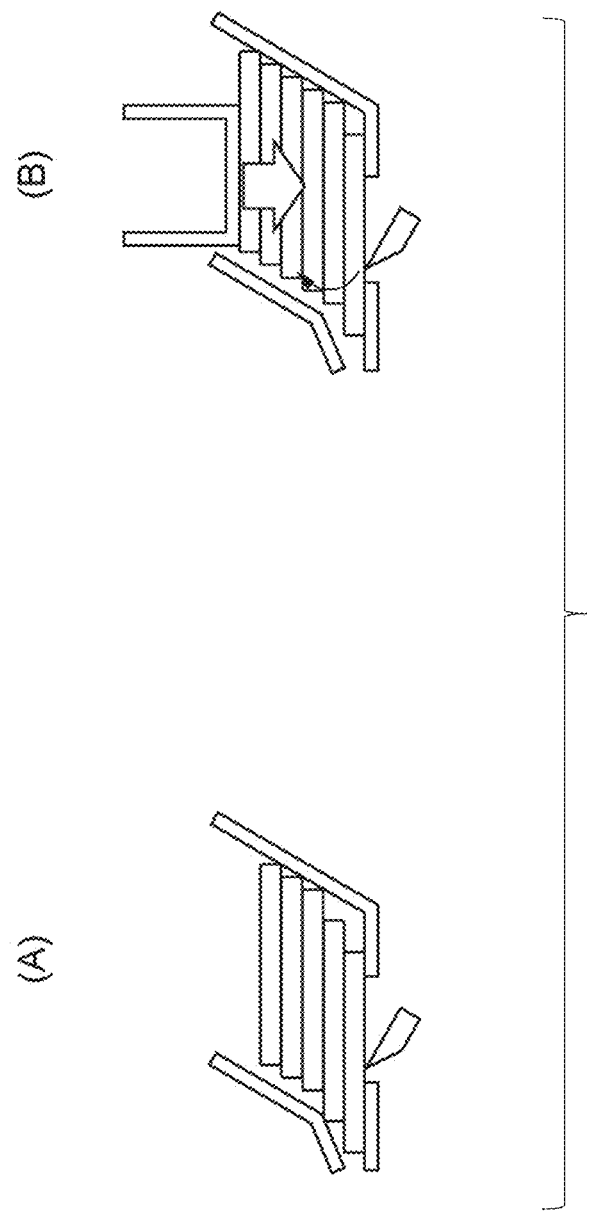
FIGS. 7B (A) and (B) of FIG. 7B are schematic diagrams each showing a cross section of a refill according to a comparative configuration.

As schematically shown in (A) of FIG. 7B, a phenomenon (so-called double layer clutch) occurs in which the lowermost staple sheet and the staple sheet on an upper layer thereof enter a gradually narrowing discharge opening, and the staple sheets may be locked (clogged) in the vicinity of the discharge opening. Meanwhile, in the refill 10 according to the present embodiment, since the staple sheets SS are displaced in the axial direction AD, that is, the inclination directions of the left side wall 20L and the right side wall 20R are a direction different from a discharge direction (forward direction) of the staple sheets SS, a problem of double-feed clutching does not occur.

Further, in the comparative configuration, since the front wall is inclined, a vicinity of a front end portion of the staple sheet cannot be pressed as schematically shown in (B) of FIG. 7B. Therefore, the stacked staple sheets are inclined rearward (front ends of the staple sheets float), and as a result, a center of gravity of the stacked staple sheets is shifted rearward. Further, as indicated by an arrow in the figure, a rotational moment is generated in a direction in which the front ends of the staple sheets float from the bottom surface. Therefore, there is a possibility that a sufficient force is not applied to separate the staple sheet from a feeding means (for example, a feeding claw) of an electric stapler, and a feeding failure occurs. However, in the refill 10 according to the present embodiment, the front end of the staple sheet SS can be pressed since the staple sheet is displaced in the axial direction (the left-right direction), so that the occurrence of feeding failure associated with the comparative configuration can be prevented.

Further, in the comparative configuration, the front wall of the refill is inclined, the rear wall of the refill is also inclined accordingly, and thus a volume of the refill in the front-rear direction is increased. As a result, a volume in the front-rear direction of an electric stapler in which a cartridge loaded with the refill is attached is increased. An electric stapler built in a finisher (post-processing apparatus) such as a copier or a printer is provided to be movable in the axial direction AD (left-right direction) because it is necessary to execute a stapling process at different positions, such as when performing the stapling process at an upper left portion of the paper or at a lower left portion of the paper. Therefore, when the volume of the electric stapler in the front-rear direction is increased, it is necessary to secure a space for the increasing volume of the electric stapler in the front-rear direction over a moving range of the electric stapler in the axial direction AD so as not to collide with the electric stapler moving in the axial direction AD (left-right direction) in order to execute the stapling process at different positions. Therefore, the finisher may be increased in size.

Since the inclination directions of the left side wall 20L and the right side wall 20R of the refill 10 according to the present embodiment are the axial direction AD (the left-right direction) and a space that is originally secured for the electric stapler that moves in the axial direction AD (the left-right direction) is used, an increase in size of the finisher accompanying the adoption of the comparative configuration can be prevented.

Further, since the width SW of one staple S in the coupling direction has a tolerance, a tolerance of the length SSW of the long side of the staple sheet SS increases as the number of connections in the staple sheet SS increases. When the tolerance of the length SSW of the long side of the staple sheet SS increases, an interval between the front wall and the rear wall needs to have a margin equal to or larger than the tolerance to avoid clogging of the staple sheets SS. However, when the interval between the front wall and the rear wall is set to be large (when the margin is large), there is a possibility that the staple sheet reaches the bottom wall without coming into contact with the rear wall, and the staple sheet may not be shifted forward. Further, since the margin is large, the staple sheet may rattle in the refill and a feeding performance of the staple sheet may be affected.

Meanwhile, in the refill 10 according to the present embodiment, since the inclination directions of the left side wall 20L and the right side wall 20R are the axial direction AD (the left-right direction) and a gap between the left side wall 20L and the right side wall 20R may be provided in consideration of a tolerance of the length SL of the staple S in the axial direction, as compared with the comparative configuration, it is possible to take a relatively small margin, the staple sheet SS can be firmly shifted, and the feeding performance is not affected because the staple sheet SS does not rattle greatly in the refill 10.

Further, since a plurality of staples S extending substantially straight are connected in the coupling direction, the staple sheet SS has irregularities in the coupling direction (FIG. 2C and FIG. 2D). In the comparative configuration, since the staple sheet is displaced in the forward direction (coupling direction), when the staple sheet is displaced, a concave surface of the staple sheet on the upper layer (a surface between the adjacent staples) and a convex surface of the staple sheet on a lower layer (an upper surface of the staple) rub against each other (the irregularities of the upper and lower staple sheets becomes a resistance), so that a large load is generated and the staple sheet is difficult to be shifted. Further, since the staple sheet tends to follow an arc shape in the coupling direction, a load between the staple sheet on the upper layer and the staple sheet on the lower layer is further increased, which causes a feeding failure.

Meanwhile, the displacement direction of the staple sheet SS according to the present embodiment is the flat axial direction AD (left-right direction) as shown in FIG. 2A and FIG. 2B, so that the occurrence of feeding failure due to an increase in sliding load, which the comparative configuration suffers from can be prevented.

The basic configuration of the refill 10 according to the present embodiment has been described above. Hereinafter, another configuration of the refill 10 will be described.

[Discharge Prevention Mechanism for Staple Sheet]

As described above, the refill 10 according to the present embodiment additionally includes, as a discharge prevention mechanism for preventing the staple sheet SS from unintentionally flying out from the discharge opening, the front end portion 20ST that functions as a stopper for the staple sheet.

Figure 8A:
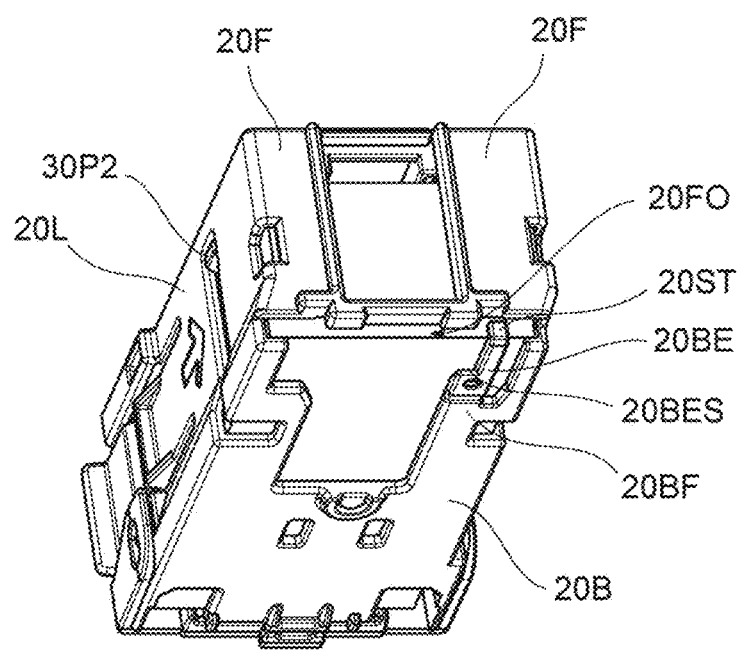
FIG. 8A is a perspective view of the refill according to the embodiment.
Figure 8B:
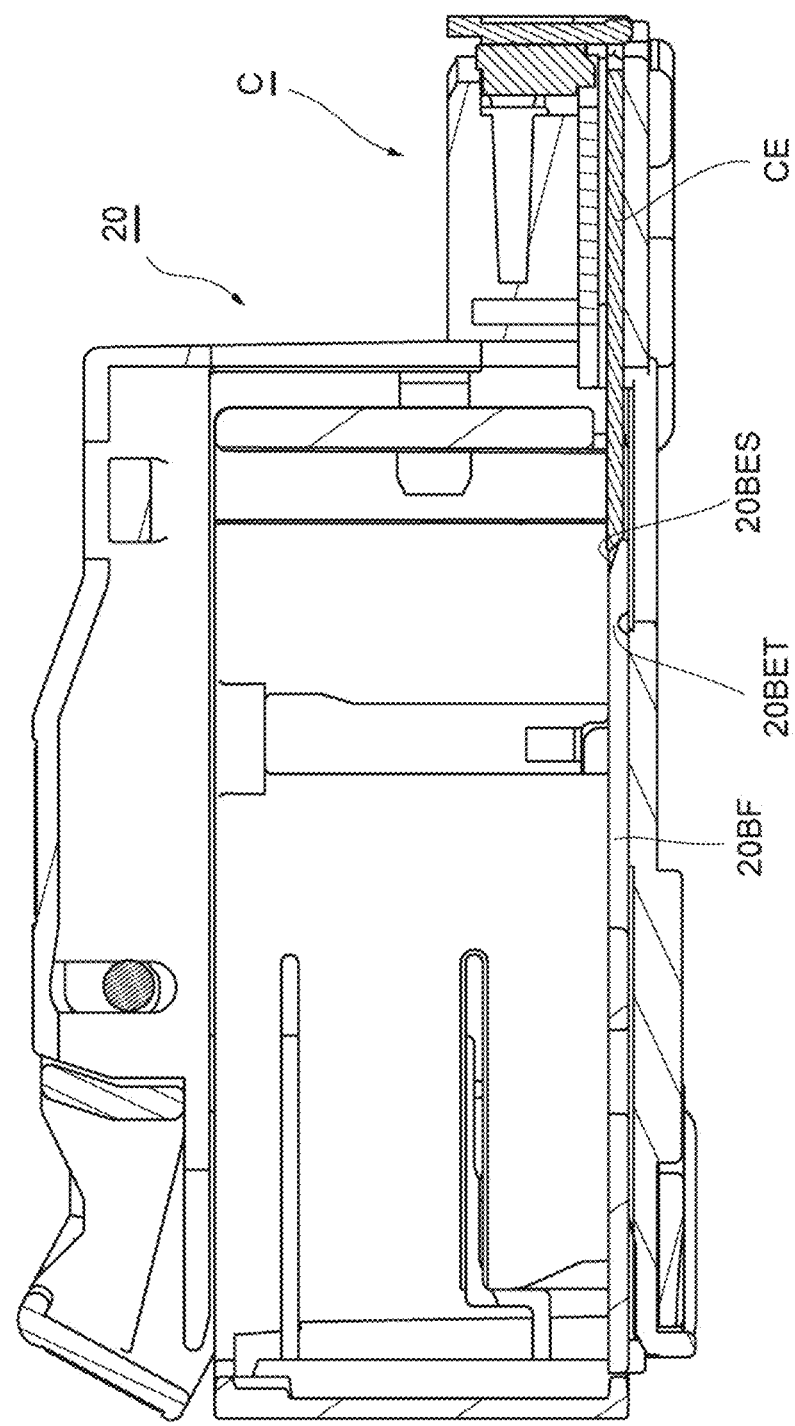
FIG. 8B is a cross-sectional view of the refill according to the embodiment.
Figure 8C:
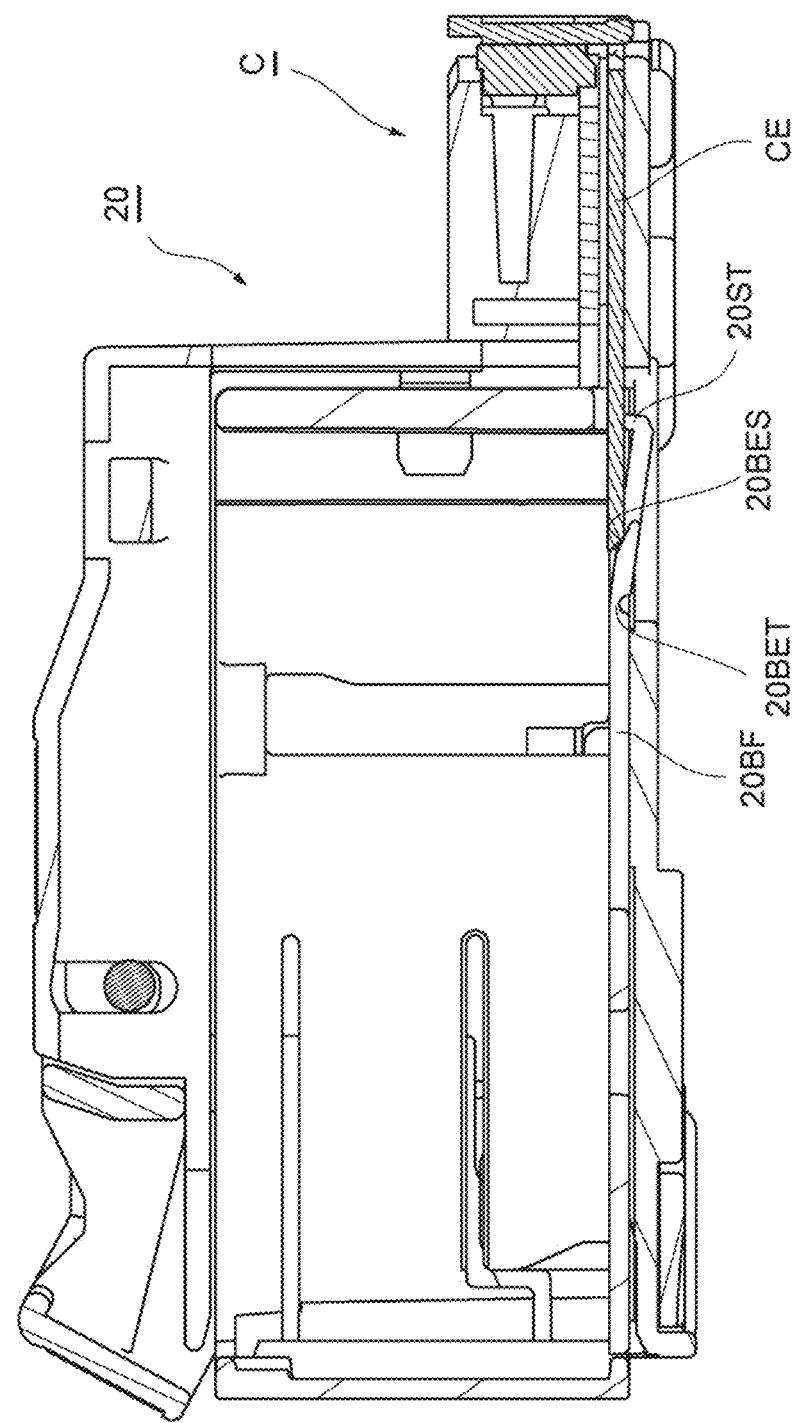
FIG. 8C is a cross-sectional view of the refill according to the embodiment.

FIG. 8A is a perspective view of the refill 10 according to the present embodiment as viewed from below. FIG. 8B and FIG. 8C are cross-sectional side views in which the discharge prevention mechanism is cut along a virtual plane parallel to the front-rear direction. Regarding the discharge prevention mechanism, the refill 10 includes the bottom wall 20B on which the staple sheet SS obtained by coupling a plurality of staples, each of which extends in the axial direction thereof, in a direction orthogonal to the axial direction is placed; and the front wall 20F in which the discharge opening 20FO for discharging the staple sheet SS in the coupling direction of the staples is formed. Further, the bottom wall 20B includes a rear end portion 20BF that serves as a fixed end; an extending portion 20BE that extends in the forward direction (coupling direction) from the rear end portion 20BF; and a front end portion 20ST that extends upward from a front end of the extending portion 20BE, is disposed in at least a part of a region in front of the discharge opening 20FO so as to close at least a part of the discharge opening 20FO, and serves as a free end. Here, the extending portion 20BE is formed to be elongated in the front-rear direction due to openings or slits respectively formed on left and right sides thereof.

The refill 10 prevents the staple sheet SS from unintentionally flying out by a configuration including the rear end portion 20BF, the extending portion 20BE, and the front end portion 20ST, as the discharge prevention mechanism for the staple sheet SS. In addition to a case in which the front end portion 20ST comes into contact with the discharge opening 20FO to close a part of the discharge opening 20FO such that an opening area of the discharge opening 20FO reduces, the closing of the discharge opening 20FO also includes a case in which a part of the discharge opening 20FO is closed by disposing the front end portion 20ST forward than the discharge opening 20FO.

According to the above configuration, since the front end portion 20ST extends upward from below and closes at least a part of the region in front of the discharge opening 20FO, the staple sheet SS can be prevented from unintentionally flying out from the discharge opening 20FO. Further, since the front end portion 20ST is a free end, for example, when the refill is attached to the cartridge C or the like, the front end portion 20ST or the extending portion 20BE receives a downward force from the cartridge C or the like, and thus the front end portion 20ST is retracted (displaced) downward and the region in front of the discharge opening 20FO can be opened. Therefore, when the refill is attached to the cartridge C or the like, forward movement of the staple sheet SS can be allowed.

Patent Literature 2 discloses a discharge prevention mechanism in which a locking member (lid member in Patent Literature 2) rotatably provided on a front wall of the refill with the front-rear direction as a rotation axis is provided on the front wall as the discharge prevention mechanism, and the locking member is rotated when the refill is attached to the cartridge, thus moving from a state where the discharge opening is closed to a released state. However, in such a related-art discharge prevention mechanism, it is necessary to form the locking member in an elongated shape such that the locking member provided on the front wall can rotate to close the discharge opening. For the locking member extending vertically when the refill is attached to the cartridge, during pulling of the refill in order to separate the cartridge and the refill after the staple sheets are consumed, when an upper end of the locking member protrudes from the upper lid portion, there is a possibility that the locking member interferes with the urging member of the cartridge for pressing the upper lid portion of the refill. Therefore, a thickness of the upper lid portion needs to be increased such that the upper end of the locking member does not protrude, and as a result, the refill, the cartridge, and hence the finisher are increased in size in the upper-lower direction.

The discharge prevention mechanism for the staple sheet according to the present embodiment includes the extending portion 20BE that extends forward below the staple sheets SS where the bottom wall 20B is provided; and the front end portion 20ST that is a free end and extends upward from the front end of the extending portion 20BE to close at least a part of the region in front of the discharge opening 20FO. As long as the front end portion 20ST slightly protrudes from the bottom surface 20BS of the bottom wall 20B, at least a part of the region in front of the discharge opening 20FO can be closed. Therefore, according to the discharge prevention mechanism of the present embodiment, a reduction in thickness of the upper lid portion 30 can be promoted, and a reduction in size of the refill, the cartridge, and hence the finisher in the upper-lower direction can be promoted.

Figure 8D:
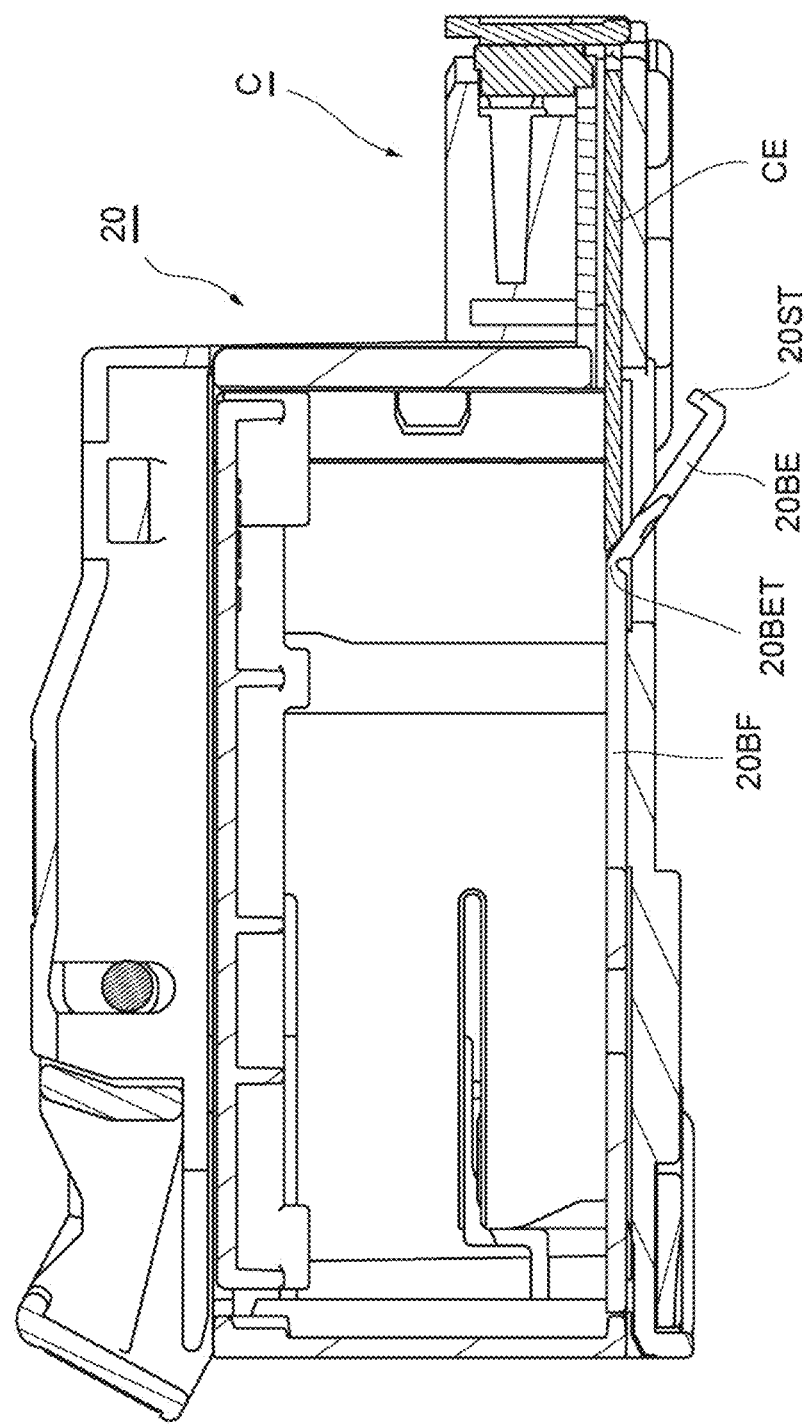
FIG. 8D is a cross-sectional view of the refill according to the embodiment.

Further, the extending portion 20BE of the discharge prevention mechanism for the staple sheet SS according to the present embodiment includes a pressing surface 20BES that receives an external force to move the front end portion 20ST downward. FIGS. 8B to 8D show a state where, when the refill 10 is attached to the cartridge C by being moved forward with respect to the cartridge C, the pressing surface 20BES of the discharge prevention mechanism of the refill 10 comes into contact with a pressing member CE of the cartridge C and receives an external force, the front end portion 20ST moves downward.

As shown in a cross-sectional view of FIG. 8B, the pressing surface 20BES according to the present embodiment has an inclination facing upward and forward. Therefore, the pressing surface 20BES generates a component force directed downward by receiving an external force directed rearward. Therefore, the pressing surface 20BES, a portion of the extending portion 20BE forward than the pressing surface, and the front end portion 20ST which is a free end are provided to be movable downward. On the other hand, the cartridge C includes the pressing member CE that is provided to be able to come into contact with the pressing surface 20BES and that extends rearward.

According to such a configuration, when the refill 10 is moved forward and attached to the cartridge C, the pressing member CE which comes into contact with and presses the pressing surface 20BES is provided on the cartridge C, and the pressing surface 20BES receives an external force from the pressing member CE of the cartridge C, and thus the front end portion 20ST which is a free end can be retracted downward to open the region in front of the discharge opening 20FO. The pressing surface 20BES may be formed on the front end portion 20ST.

In the related-art discharge prevention mechanism, since the locking member having the front-rear direction as the rotational axis is provided, when an external force is applied from the pressing member of the cartridge when the refill is moved forward and attached to the cartridge, a rotational moment with the upper-lower direction as a rotational axis is generated between a portion where the locking member is pressed and a rotational shaft fixed to the front wall, so that the locking member may rotate with the upper-lower direction as a rotation axis rather than the front-rear direction.

The bottom wall 20B of the refill 10 according to the present embodiment includes the rear end portion 20BF serving as a fixed end, the extending portion 20BE extending forward from the rear end portion 20BF, and the front end portion 20ST provided at the front end of the extending portion 20BE and serving as a free end. Therefore, when an external force is applied from the pressing member of the cartridge C when the refill 10 is moved forward and attached to the cartridge C, a rotational moment with the left-right direction as a rotation axis is generated between the pressing surface 20BES and the rear end portion 20BF. The rotational moment causes the front end portion 20ST, which is a free end, to move downward. Therefore, a situation in which the locking member is rotated in an unintended direction by an external force as in related-art discharge prevention mechanism can be prevented, and the external force can be efficiently used to move the front end portion 20ST downward.

Further, the extending portion 20BE according to the present embodiment includes a thin portion 20BET, which has a small thickness in the upper-lower direction, at a portion between the pressing surface 20BES and the rear end portion 20BF serving as a base end of the rotation. Specifically, the thin portion 20BET having a recessed surface recessed from below to above is provided in a part of the extending portion 20BE between the pressing surface 20BES and the rear end portion 20BF. According to such a configuration, bending rigidity of the extending portion 20BE decreases, and thus the downward movement of the front end portion 20ST can be promoted. The discharge prevention mechanism of the present embodiment is formed such that the front end portion 20ST is located downward than the bottom wall 20B during attachment to the cartridge C by moving the front end portion 20ST downward with the thin portion 20BET as a fulcrum, as shown in FIG. 8D.

As shown in FIG. 5C, an upper end of the front end portion 20ST is preferably provided at a position upward than a lower end of the front wall 20F. According to such a configuration, the staple sheets SS upward than the upper end of the front end portion 20ST can be prevented from flying out unintentionally in a state where the refill is not attached to the cartridge C.

[Fixing Mechanism for Refill and Cartridge]

When the separation of the refill from the cartridge is allowed during the use of the staple sheet, there is a possibility that the staple of the staple sheet is damaged or causes clogging.

Therefore, the refill 10 according to the present embodiment additionally includes a fixing mechanism for the refill 10 and the cartridge C which is engaged with the cartridge C to prohibit separation from the cartridge C in a state where the staple sheets SS remain in the refill 10, and allows the separation from the cartridge C in a state where no staple sheet SS exists in the refill 10.

As shown in FIG. 3B and FIG. 6B, the right side wall 20R includes the cartridge engagement right wall portion 20RE (an example of a "first engagement wall portion") as a first fixing mechanism. Specifically, the right side wall 20R includes the cartridge engagement right wall portion 20RE configured to be displaced inward (in a direction approaching the left side wall 20L) and provided with a first engagement projection portion 20RP that protrudes outward (in a direction away from the left side wall 20L) for engagement with the cartridge C.

Figure 9:
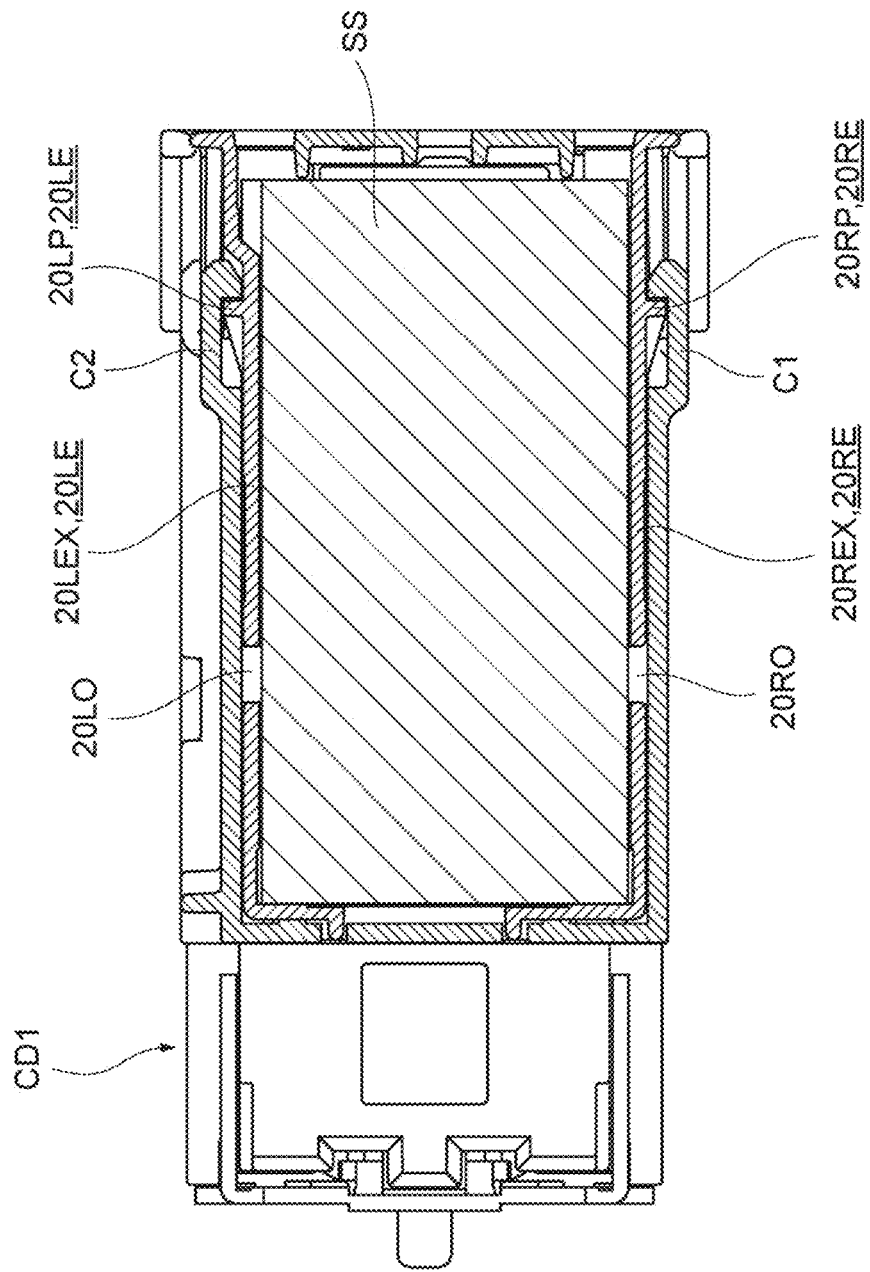
FIG. 9 is a horizontal cross-sectional view of the refill and a cartridge according to the embodiment.

FIG. 9 is a cross-sectional view of the refill 10 attached to the cartridge C taken along a virtual plane perpendicular to the upper-lower direction and passing through the first engagement projection portion 20RP.

As shown in the figure, according to the above configuration, separation between the refill 10 and the cartridge C can be prevented by providing, on the cartridge C, a first recessed portion C1 which is engaged with the first engagement projection portion 20RP when the refill 10 is moved forward and attached to the cartridge C.

Further, the first engagement projection portion 20RP formed at a predetermined position on the refill 10 and the first recessed portion C1 formed at a predetermined position on the cartridge C are configured to engage with each other, and thus the refill 10 can be positioned with respect to the cartridge C based on the engagement between the first engagement projection portion 20RP and the first recessed portion C1.

As shown in FIG. 3A and FIG. 6A and the like, similar to the right side wall 20R, the left side wall 20L includes the cartridge engagement left wall portion 20LE (an example of a "second engagement wall portion"), and specifically, the left side wall 20L includes the cartridge engagement left wall portion 20LE configured to be displaced inward (in a direction approaching the right side wall 20R) and provided with a second engagement projection portion 20LP that protrudes outward (in a direction away from the right side wall 20R) for engagement with the cartridge. Similarly, the separation between the refill 10 and the cartridge C can be prevented by providing, on the cartridge C, a second recessed portion C2 which is engaged with the second engagement projection portion 20LP when the refill is attached to the cartridge C.

Here, the first engagement projection portion 20RP (the second engagement projection portion 20LP) may have an inclined surface that is inclined such that a protruding amount increases as moving rearward. By providing such an inclined surface, the refill 10 can be attached to the cartridge C such that the refill 10 is smoothly moved forward and the first engagement projection portion 20RP (second engagement projection portion 20LP) and the first recessed portion C1 (second recessed portion C2) of the cartridge C are engaged.

The first engagement projection portion 20RP (second engagement projection portion 20LP) may be formed to extend in the upper-lower direction. BY forming in this way, the engagement and positioning with respect to the cartridge C can be reliably performed.

Further, as shown in FIG. 9, as long as the staple sheet SS is present at a position facing an inner wall surface of the cartridge engagement right wall portion 20RE (left wall portion 20LE), an inward displacement of the cartridge engagement right wall portion 20RE (left wall portion 20LE) is restricted due to a collision with the staple sheet SS, and thus the separation between the refill 10 and the cartridge C can be prevented. On the other hand, if the staple sheet SS is consumed and no staple sheet SS exists in the refill 10, the inward displacement of the cartridge engagement right wall portion 20RE (left wall portion 20LE) is allowed, so that the engagement between the first engagement projection portion 20RP (second engagement projection portion 20LP) and the first recessed portion C1 (second recessed portion C2) is released, and the separation between the refill 10 and the cartridge C is allowed.

Further, as shown in FIG. 6A, FIG. 6B and the like, the right side wall 20R (left side wall 20L) according to the present embodiment includes, as the cartridge engagement right wall portion 20RE (left wall portion 20LE), a front end portion 20RF (a front end portion 20LF) having a fixed end; an extending portion 20REX (an extending portion 20LEX) having the first engagement projection portion 20RP (second engagement projection portion 20LP) extending rearward from the front end portion 20RF (front end portion 20LF) and protruding outward; and a rear end portion 20RR (a rear end portion 20LR) provided rearward of the extending portion 20REX (extending portion 20LEX) and serving as a free end. Since a free end is provided on the cartridge engagement right wall portion 20RE (left wall portion 20LE), two slits extending in the front-rear direction are formed at a boundary between the right side wall 20R (the left side wall 20L) and the cartridge engagement right wall portion 20RE (left wall portion 20LE). The front end portion 20RF (front end portion 20LF) serving as a fixed end corresponds to a wall portion between the two slits. Since the rear end portion 20RR (rear end portion 20LR) serving as a free end is provided, the cartridge engagement right wall portion 20RE (left wall portion 20LE) can be easily displaced inward. Only one of the right side wall 20R and the left side wall 20L may be provided with a configuration corresponding to the cartridge engagement right wall portion 20RE (left wall portion LE).

Further, the rear end portion 20RR (rear end portion 20LR) of the cartridge engagement right wall portion 20RE (left wall portion 20LE) is formed to extend downward than the extending portion 20REX (the extending portion 20LEX). By increasing a size of the rear end portion 20RR (rear end portion 20LR) in the upper-lower direction relative to the extending portion 20REX (extending portion 20LEX) in this manner, a volume and mass of the free end portion separated from the front end portion 20RF (front end portion 20LF) serving as a fixed end can be increased, and thus the cartridge engagement right wall portion 20RE (left wall portion 20LE) can be easily displaced inward. Further, a lower end of the rear end portion 20RR (rear end portion 20LR) is formed closer to the bottom surface 20BS of the bottom wall 20B than a lower end of the extending portion 20REX (extending portion 20LEX) is, and thus a range in which the inward displacement of the cartridge engagement right wall portion 20RE (left wall portion 20LE) can be restricted can be increased. Here, when a height of a lower end of the cartridge engagement right wall portion 20RE (left wall portion 20LE) from the bottom surface 20BS of the bottom wall 20B is set to a first height, in a case where an upper surface of the uppermost staple sheet SS is located above the first height from the bottom surface 20BS of the bottom wall 20B, the inward displacement of the cartridge engagement right wall portion 20RE (left wall portion 20LE) is restricted, so that the separation between the refill 10 and the cartridge C can be prevented.

Subsequently, a second fixing mechanism for the refill 10 and the cartridge C will be described in which even when the consumption of the staple sheets SS progresses and the upper surface of the uppermost staple sheet SS in the refill 10 becomes equal to or smaller than the first height from the bottom surface 20BS of the bottom wall 20B, the separation from the cartridge C is prohibited by the engagement with the cartridge C, and in a state where no staple sheet SS exists in the refill 10 (FIG. 3C), the separation from the cartridge C is allowed. The refill 10 may include any one of the first fixing mechanism and the second fixing mechanism or may not include any one of the first fixing mechanism and the second fixing mechanism.

Figure 10A:
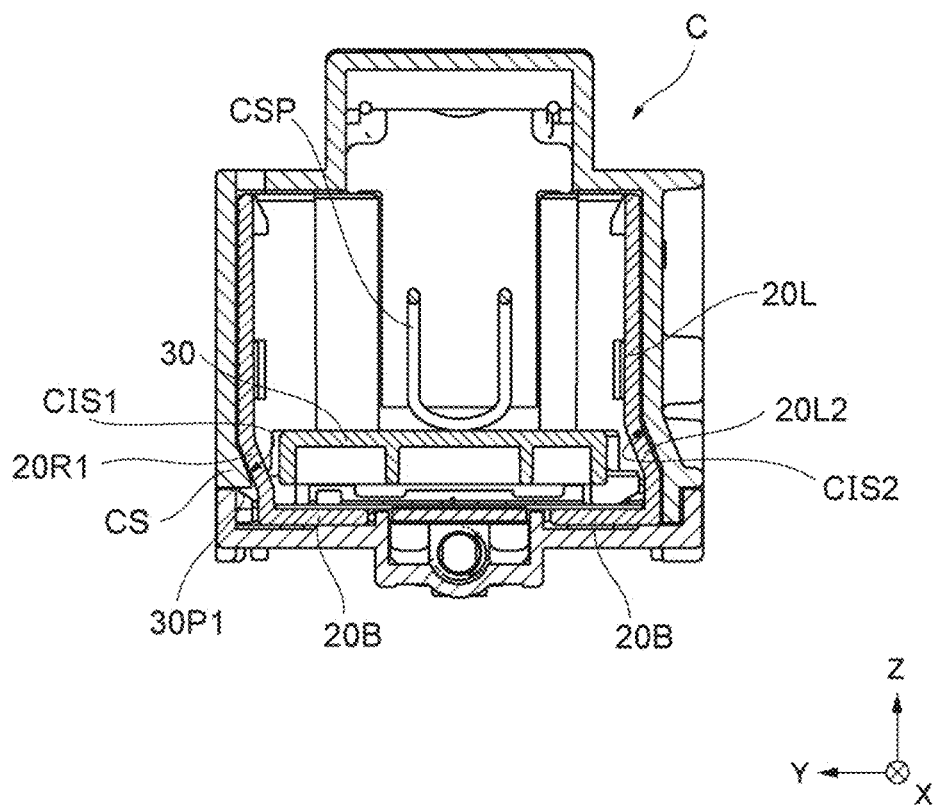
FIG. 10A is a vertical cross-sectional view of the refill and the cartridge according to the embodiment.
Figure 10B:
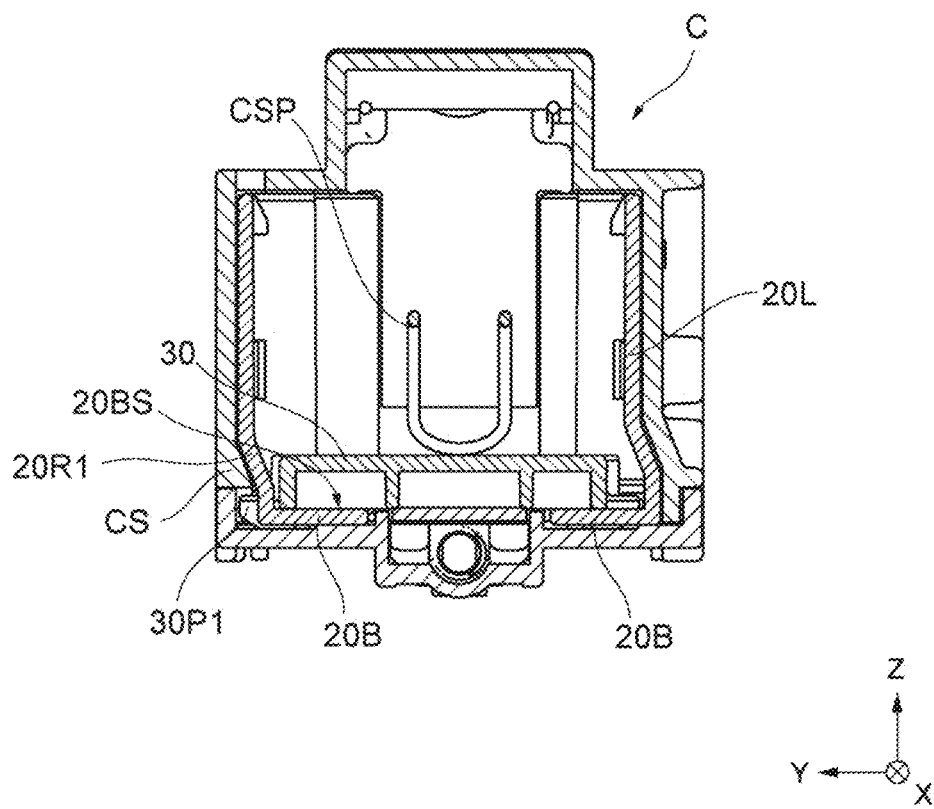
FIG. 10B is a vertical cross-sectional view of the refill and the cartridge according to the embodiment.

FIG. 10A is a cross-sectional view taken along a virtual plane perpendicular to the front-rear direction and passing through a region rearward than the opening 20RO and the opening 20LO when the number of the staple sheets SS remaining in the refill 10 attached to the cartridge C is one, and FIG. 10B is a cross-sectional view taken along a virtual plane perpendicular to the front-rear direction and passing through a region rearward than the opening 20RO and the opening 20LO when there is no staple sheet SS in the refill 10 attached to the cartridge C.

The upper lid portion 30 of the refill 10 according to the present embodiment includes, as the second fixing mechanism, a projection portion (first lid projection portion 30P1) that is engaged with the opening 20RO formed to extend vertically over at least a part of the right upper side wall 20RU and a part of the first inclined wall 20R1 and that protrudes from the opening 20RO formed in the first inclined wall 20R1 when the upper lid portion 30 descends to a position facing the first inclined wall 20R1.

As shown in FIGS. 10A and 10B, since the first inclined wall 20R1 is inclined in a direction approaching the left side wall 20L as advancing downward, a space in which no wall portion of the refill 10 exists is below the right upper side wall 20RU. Therefore, the first lid projection portion 30P1 according to the present embodiment is formed to move downward along the opening 20RO as the staple sheets SS are consumed, and protrude outward from the opening 20RO formed in the first inclined wall 20R1 when reaching the first inclined wall 20R1.

According to such a configuration, the separation between the refill 10 and the cartridge C can be prevented by providing, on the cartridge C, the stopper CS for restricting the rearward movement of the first lid projection portion 30P1 at a position at least behind the first lid projection portion 30P1 which protrudes outward from the opening 20RO in the first inclined wall 20R1 of the refill 10 attached to the cartridge C.

The first lid projection portion 30P1 and the second lid projection portion 30P2 are formed in a manner of not protruding respectively from the opening 20RO in the right upper side wall 20RU and the opening 20LO in the left upper side wall 20LU. However, at least one of the first lid projection portion 30P1 and the second lid projection portion 30P2 may be formed to protrude from the opening 20RO in the right upper side wall 20RU or from the opening 20LO in the left upper side wall 20LU, and the stopper for restricting the rearward movement of the protruding first lid projection portion 30P1 and second lid projection portion 30P2 may be provided on the cartridge C.

Further, as shown in FIG. 10B, the stopper CS for the refill on the cartridge C is configured to allow the refill 10 to be separated from the cartridge C in a state where all of the staple sheets SS are consumed and no staple sheet SS exists in the refill 10. Specifically, the stopper CS is formed upward than the first lid projection portion 30P1 in a state where the upper lid portion 30 comes into contact with the bottom surface 20BS of the bottom wall 20B as a result of the consumption of all the staple sheets SS.

According to such a configuration, in a state where no staple sheet SS exists in the refill 10, the refill 10 can be separated from the cartridge C by pulling the refill 10 rearward such that the first lid projection portion 30P1 of the upper lid portion 30 passes below the stopper CS.

Patent Literature 3 discloses a fixing mechanism for a refill and a cartridge, in which an engagement portion to be engaged with an opening formed in a rear wall of the refill is provided in a rear wall of the cartridge and the engagement with the cartridge is released by displacing the rear wall of the refill. According to the related-art fixing mechanism, when the staple sheets remain in the refill, the rear wall of the refill cannot be displaced, so that the refill and cartridge can be fixed only when the staple sheets remain in the refill.

However, in the related-art fixing mechanism, it is necessary to provide, in the rear wall of the cartridge, the engagement portion for engagement with the opening formed in the rear wall of the refill, which is difficult to be applied to a type of refill that is moved forward and attached to a cartridge. Further, during use of a last staple sheet, there is a possibility that the displacement of the rear wall of the refill is allowed.

Further, Patent Literature 4 discloses a fixing mechanism that prevents separation between a refill and a cartridge by providing, on an upper lid portion of the refill, a guide protruding portion protruding from an opening formed in a side wall of the refill, and providing, on the cartridge behind the guide protruding portion protruding from the side wall of the refill, an engagement portion for restricting rearward movement of the guide protruding portion.

However, in the related-art fixing mechanism, it is necessary to provide a gap between the guide protruding portion and the opening such that the guide protruding portion smoothly descends as the staple sheets are used. Therefore, the refill cannot be positioned with respect to the cartridge simply by attaching the refill to the cartridge.

According to the first fixing mechanism according to the present embodiment, since the left side wall 20L includes the cartridge engagement left wall portion 20LE configured to be displaced inward (in a direction approaching the right side wall 20R) and including the second engagement projection portion 20LP that protrudes outward (in a direction away from the right side wall 20R), and the right side wall 20R includes the cartridge engagement right wall portion 20RE (left wall portion 20LE) configured to be displaced inward (in a direction approaching the left side wall 20L) and including the first engagement projection portion 20RP that protrudes outward (in a direction away from the left side wall 20L), the refill 10 can be positioned with respect to the cartridge C by engaging the first recessed portion C1 (second recessed portion C2) of the cartridge C with the first engagement projection portion 20RP (second engagement projection portion 20LP). Further, the engagement between the refill 10 and the cartridge C can be released in response to the inward displacement of the cartridge engagement right wall portion 20RE (left wall portion 20LE) provided on the right side wall 20R (left side wall 20L), which is suitable for a type of refill 10 that is moved forward and attached to the cartridge C.

It is preferable that, with a height from the bottom surface 20BS of the bottom wall 20B as a reference, the lower end of the cartridge engagement right wall portion 20RE (left wall portion 20LE) is formed to be the same as or lower than an upper end of the first inclined wall 20R1 (second inclined wall 20L2).

According to such a configuration, regardless of the number of the staple sheets SS in the refill 10, that is, even when the upper surface of the uppermost staple sheet SS in the refill 10 is located at any height from the bottom surface 20BS of the bottom wall 20B, the separation between the refill 10 and the cartridge C can be prevented by at least any one of the first fixing mechanism and the second fixing mechanism.

[Configuration of Upper Lid Portion]

When the refill attached to the cartridge is separated from the cartridge, sometimes the refill cannot be smoothly separated. One of the causes is that the electric stapler or the urging member of the cartridge that presses the upper surface of the upper lid portion downward may be caught by the upper lid portion when the refill is separated from the cartridge.

Therefore, on the upper surface 30US of the upper lid portion 30 of the refill 10 according to the present embodiment, a region where the urging member CSP (for example, a screw coil spring) of the cartridge C comes into contact when the refill 10 is separated from the cartridge C is formed to be smooth. Specifically, the upper surface 30US of the upper lid portion 30 includes a front end 30F (see FIG. 3A and the like) corresponding to an end portion in the coupling direction (discharge direction) in which the staple sheets SS are discharged; a first region 30AR1 pressed by the urging member CSP of the cartridge C when the staple sheets SS are placed on the bottom wall 20B in the refill 10; and a second region 30AR2 extending in the discharge direction from the first region 30AR1 and connected to the front end 30F of the upper lid portion 30. Here, the first region 30AR1 and the second region 30AR2 are formed smoothly over the entire region. For example, the first region 30AR1 and the second region 30AR2 may be formed flush with each other.

According to such a configuration, a region pressed downward by the urging member CSP from when the refill 10 is attached to the cartridge C to when the staple sheets SS are consumed and the refill 10 is separated from the cartridge C is formed to be smooth without a step (irregularity). Therefore, the refill 10 can be smoothly separated from the cartridge C.

Figure 11:
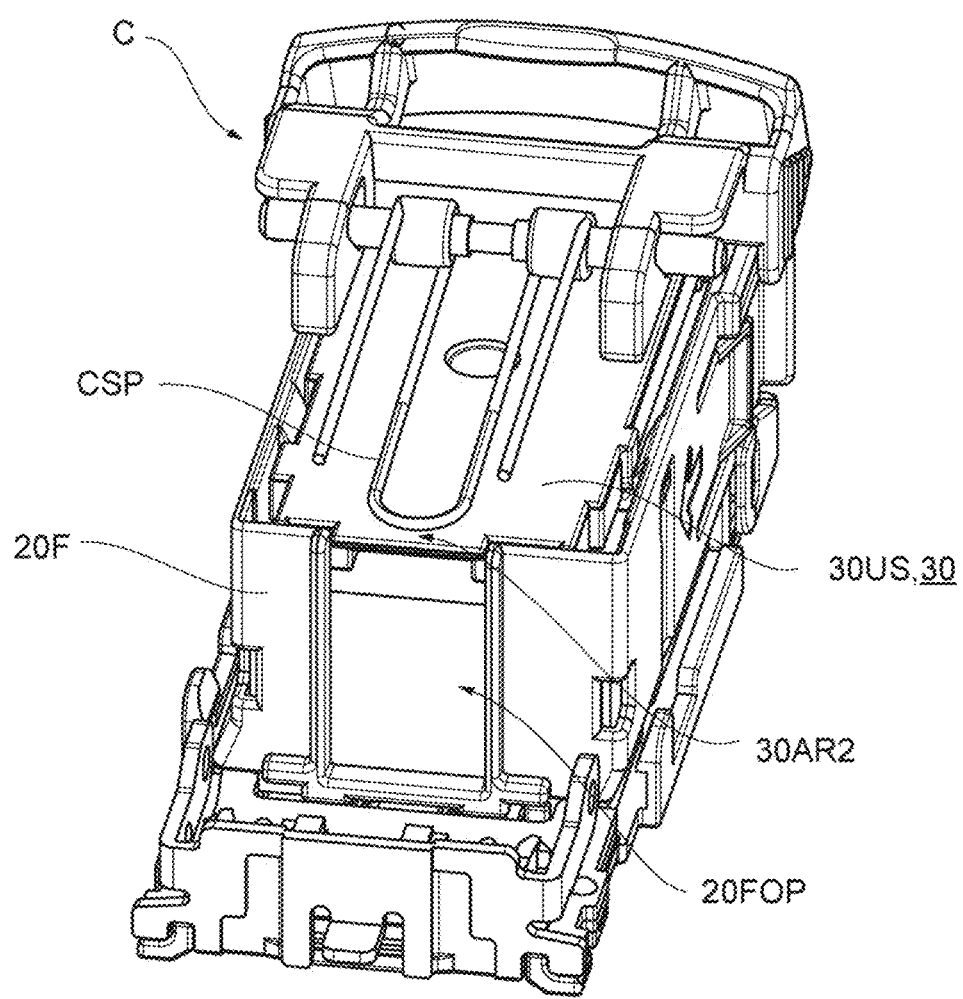
FIG. 11 is a perspective view of the refill and the cartridge according to the embodiment.
Figure 12A:
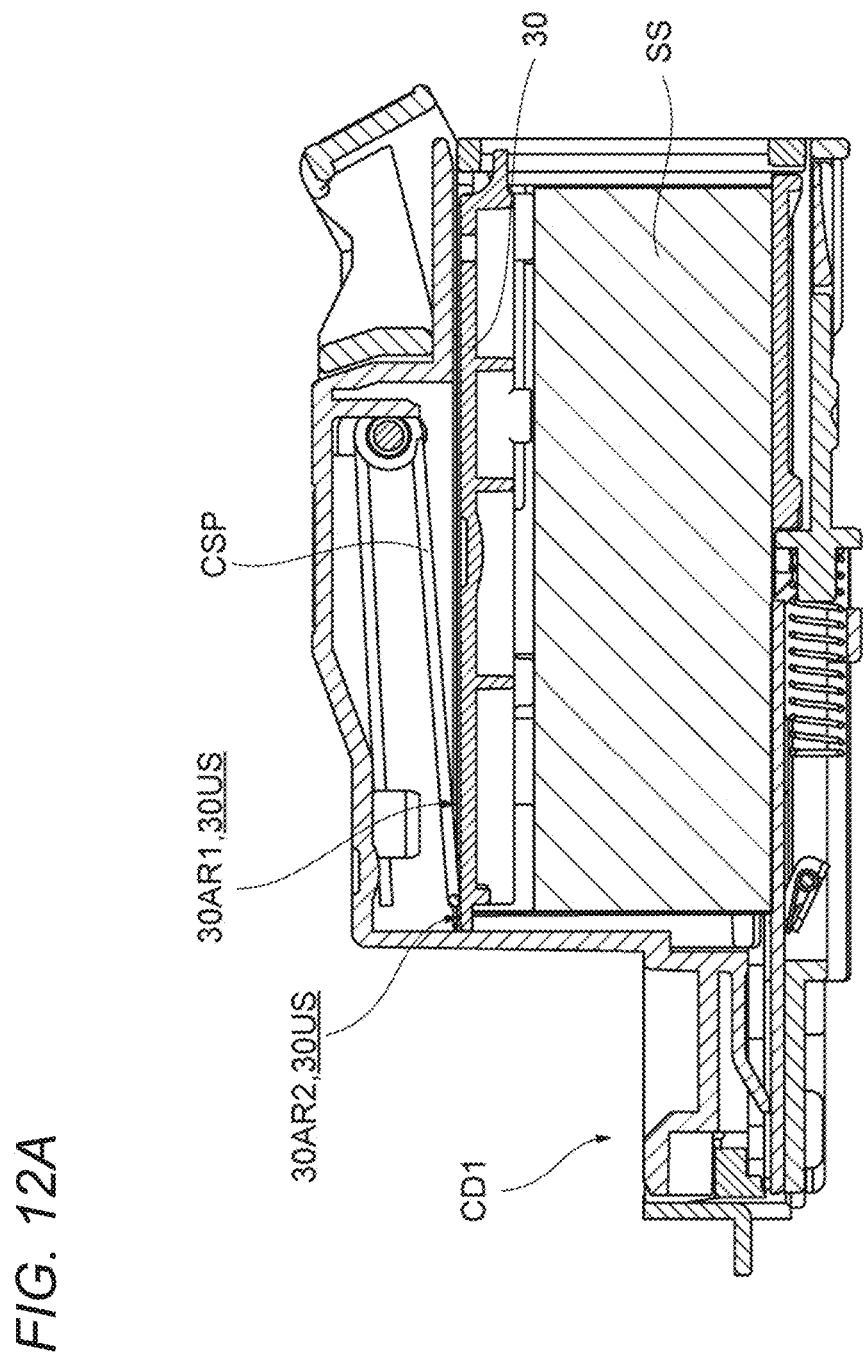
FIG. 12A is a vertical cross-sectional view of the refill and the cartridge according to the embodiment.
Figure 12B:
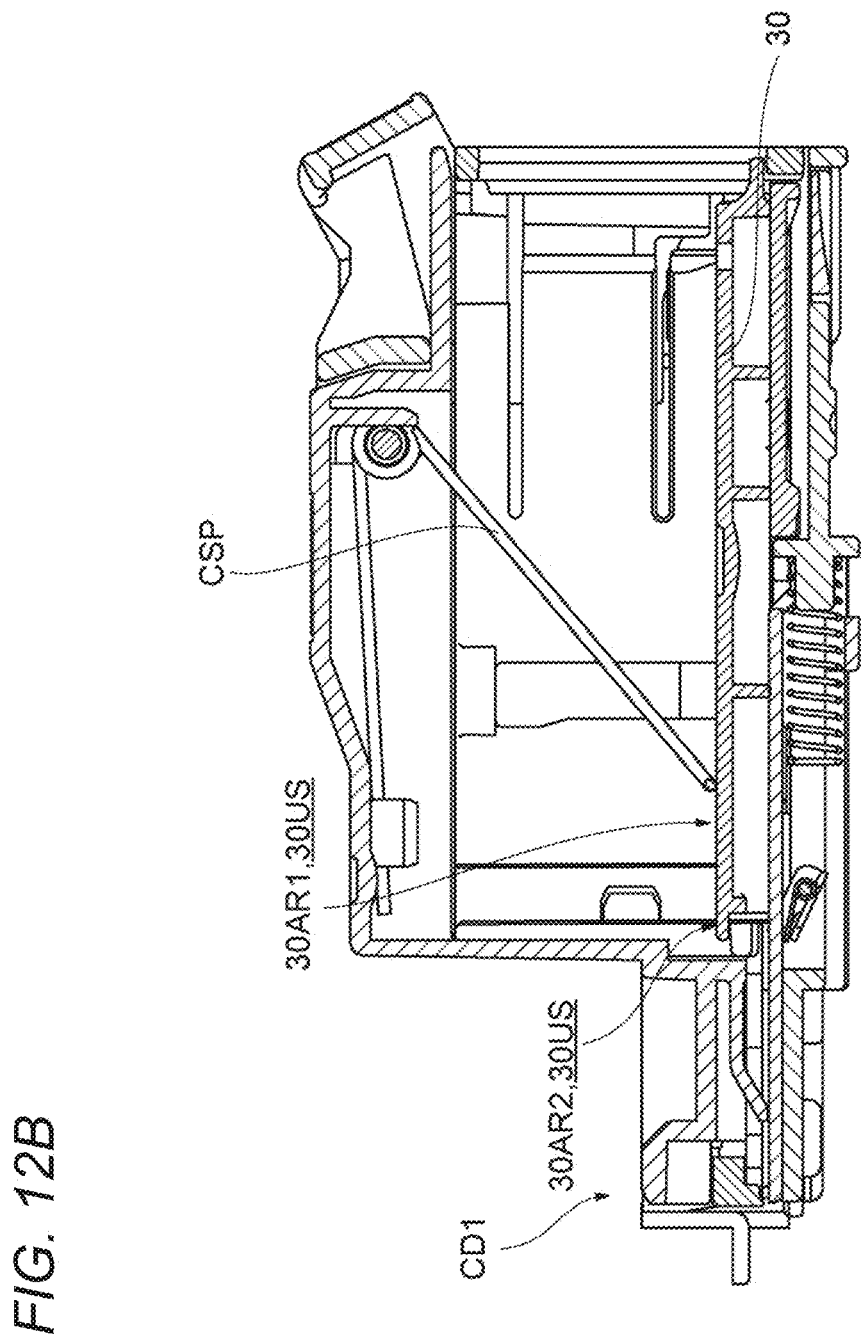
FIG. 12B is a vertical cross-sectional view of the refill and the cartridge according to the embodiment.

FIG. 11 is a perspective view showing a state (initial state) where the refill 10 in which a maximum number of staple sheets SS that the refill 10 can accommodate is placed is attached to the cartridge C. FIG. 12A is a cross-sectional view of the refill 10 taken along a virtual plane perpendicular to the left-right direction and passing through a center of the refill 10 in the left-right direction in the state of FIG. 11, and FIG. 12B is a cross-sectional view of the refill 10 taken along the same virtual plane in a state where no staple sheet SS exists in the refill 10.

As shown in the figure, in the initial state, the urging member CSP presses a region on the upper surface 30US of the upper lid portion 30 which is close to the front end 30F. Then, as the staple sheets SS are consumed, a position at which the urging member CSP presses the upper surface 30US advances rearward. Therefore, the first region 30AR1 is a region extending in the front-rear direction, and may include a partial region pressed by the urging member CSP when N staple sheets SS are placed on the bottom wall 20B, and a partial region located rearward than the partial region and pressed by the urging member CSP when M (M<N) staple sheets SS are placed on the bottom wall 20B.

The second region 30AR2 is a region connecting the first region 30AR1 and the front end 30F. In the present embodiment, since the first region 30AR1 extends widely in the front-rear direction up to a region close to the front end 30F, the second region 30AR2 corresponds to a small region connecting the first region 30AR1 and the front end 30F.

According to such a configuration, since the first region 30AR1 and the second region 30AR2 are formed to be smooth over the entire region without a step, the refill 10 can be smoothly separated from the cartridge C. Here, the upper lid portion 30 includes the fourth lid projection portion 30P4 that protrudes forward at a center portion in the left-right direction, and the fourth lid projection portion 30P4 protrudes forward than the front end of the staple sheet SS. Therefore, when the refill 10 is separated from the cartridge C, the urging member CSP can be separated from the refill 10 without abutting a wall portion other than the upper surface 30US of the upper lid portion 30.

Meanwhile, as shown in FIGS. 12A and 12B, a step may be formed in a region on the upper surface 30US of the upper lid portion 30 that advances in an opposite direction of the discharge direction (rearward direction) with respect to the first region 30AR1. In the present embodiment, since a small gap (play) is also provided between a rear end of the upper lid portion 30 and the rear wall 20RW, a step is formed in the region.

The discharge prevention mechanism for the staple sheet SS, the fixing mechanism between the refill 10 and the cartridge C, and the configuration of the upper lid portion 30 which can be additionally provided on the refill 10 according to the present embodiment have been described above.

Hereinafter, preferred configurations regarding the heights at which the first inclined wall and the second inclined wall are provided, the inclination angles of the first inclined wall and the second inclined wall, the displacement amount between the upper side wall and the lower side wall, and the like will be described.

[Heights at which First Inclined Wall and Second Inclined Wall are Provided]

It is preferable that at least a part of the second inclined wall 20L2 in the stacking direction is provided in a region (lower half) equal to or less than half of a height of the left side wall 20L with the bottom surface of the bottom wall 20B as a reference, and it is more preferable that the entire second inclined wall 20L2 is provided in the region (lower half) equal to or less than half of the height of the left side wall 20L with the bottom surface of the bottom wall 20B as a reference.

Similarly, it is preferable that at least a part of the first inclined wall 20R1 is provided in a region (lower half) equal to or less than half of a height of the right side wall 20R with the bottom surface of the bottom wall 20B as a reference, and it is more preferable that the entire first inclined wall 20R1 is provided in the region (lower half) equal to or less than half of the height of the right side wall 20R with the bottom surface of the bottom wall 20B as a reference.

For example, as shown in FIG. 4B, when the height of the left side wall 20L is set as a height 20LH and the height of the second inclined wall 20L2 (a height of the upper end of the second inclined wall 20L2) is set as a height 20L2H with the bottom surface 20BS of the bottom wall 20B as a reference, it is preferable that the height 20L2H is equal to or less than half of the height 20LH. Similarly, when the height of the right side wall 20R is set as a height 20RH and the height of the first inclined wall 20R1 (a height of the upper end of the first inclined wall 20R1) is set as a height 20R1H with the bottom surface of the bottom wall 20B as a reference, it is preferable that the height 20R1H is equal to or less than half of the height 20RH (typically, the height 20LH and the height 20RH are the same).

As described above, by providing the second inclined wall 20L2 and the first inclined wall 20R1, the blocking can be prevented by displacing (shifting) the stacked staple sheets SS in the axial direction. By providing the second inclined wall 20L2 (first inclined wall 20R1) for preventing the blocking in a region (lower half) equal to or less than half of the height of the left side wall 20L (right side wall 20R), the blocking can be suitably prevented in a lower region where the blocking tends to occur due to an influence of weights of the staple sheets SS.

Further, it is preferable that the height of the second inclined wall 20L2 (the height of the upper end of the second inclined wall 20L2) in the stacking direction from the bottom surface 20BS is larger than the height of the first inclined wall 20R1 (the height of the upper end of the first inclined wall 20R1) in the stacking direction from the bottom surface 20BS. That is, it is preferable that the height 20L2H is larger than the height 20R1H (that is, 20L2H>20R1H). In other words, it is preferable that the height of the upper end of the first inclined wall 20R1 is smaller than the height of the upper end of the second inclined wall 20L2.

With such a configuration, when the staple sheet SS comes into contact with the inner wall surface 20R1S of the first inclined wall 20R1 and is displaced in the axial direction approaching the left side wall 20L, a situation can be prevented in which a left end portion of the staple sheet SS comes into contact with the left side wall 20L and downward feeding of the staple sheet SS is inhibited.

Here, it is preferable that a difference between the height of the second inclined wall 20L2 and the height of the first inclined wall 20R1 is equal to or larger than the thickness SSH of one staple sheet SS (that is, 20L2H-20R1H≥SSH).

Similarly, it is preferable that a height 20L2HL of a lower end of the second inclined wall 20L2 in the stacking direction from the bottom surface 20BS is larger than a height 20R1HL of a lower end of the first inclined wall 20R1 in the stacking direction from the bottom surface 20BS (that is, 20L2HL>20R1HL), and it is preferable that a difference between the heights is equal to or larger than the thickness SSH of one staple sheet SS (that is, 20L2HL-20R1HL≥SSH). In other words, it is preferable that the height of the lower end of the first inclined wall 20R1 is smaller than the height of the lower end of the second inclined wall 20L2.

In addition, a height of the right lower side wall 20RL is preferably equal to or larger than half of the thickness SSH of one staple sheet SS. Here, when the height of the right lower side wall 20RL is the height 20R1HL of the lower end of the first inclined wall 20R1, it is preferable that 20R1HL≥(SSH/2).

As described above, each of the both end portions of the staple sheet SS in the axial direction AD has the tip end protruding in the axial direction AD at intermediate position in the height direction HD. Therefore, by forming the height of the right lower side wall 20RL to be equal to or larger than half of the thickness SSH of one staple sheet SS, one of the tip ends of the staple sheet SS in the axial direction AD can be abutted with the right lower side wall 20RL. Therefore, the lowermost staple sheet SS can be positioned based on the inner wall surface 20RLS of the right lower side wall 20RL.

Here, the refill 10 may be configured such that the height of the right lower side wall 20RL is equal to or larger than a maximum height of the discharge opening 20FO for the staple sheet SS and the first inclined wall 20R1 is provided upward than the discharge opening 20FO for the staple sheet SS.

In addition, at least a part of the right lower side wall 20RL may be separated from the bottom surface 20BS. In such a configuration, an interval between the right lower side wall 20RL and the bottom surface 20BS is preferably equal to or less than half of the thickness SSH of one staple sheet SS.

Even if the right lower side wall 20RL is separated from the bottom surface 20BS, as long as the interval between the right lower side wall 20RL and the bottom surface 20BS is equal to or less than half of the thickness SSH of one staple sheet SS, the axial end portion of the lowermost staple sheet SS can be brought into contact with the inner wall surface of the right lower side wall 20RL and positioned.

[Inclination Angles of First Inclined Wall and Second Inclined Wall]

An inclination angle of the first inclined wall 20R1 with respect to the right lower side wall 20RL (an angle formed by an extending direction of the first inclined wall 20R1 with respect to an extending direction of the right lower side wall 20RL in a cross-sectional view (FIG. 4B) taken along a virtual plane perpendicular to the front-rear direction and parallel to the left-right direction and the upper-lower direction) is preferably 10 degrees or more and 30 degrees or less. The displacement amount of the stacked staple sheets SS in the axial direction is small when the inclination angle is too small, the blocking is less likely to be released, and on the other hand, the blocking can be released when the inclination angle is too larger, but a width of the refill 10 in the left-right direction is too large. By setting the inclination angle to be 10 degrees or more and 30 degrees or less, the displacement amount of the staple sheet in the axial direction can be secured while reducing an increase in the width of the refill 10 in the left-right direction.

When an angle (acute angle) between the bottom surface 20BS of the bottom wall 20B and the inner wall surface 20R1S of the first inclined wall 20R1 in the virtual plane is set as α1, an inclination angle of the first inclined wall 20R1 with respect to the right lower side wall 20RL is (90−α1).

Similarly, an inclination angle of the second inclined wall 20L2 with respect to the left lower side wall 20LL (an angle formed by an extending direction of the second inclined wall 20L2 with respect to an extending direction of the left lower side wall 20LL in a cross-sectional view (FIG. 4B) taken along a virtual plane perpendicular to the front-rear direction and parallel to the left-right direction and the upper-lower direction) is preferably 10 degrees or more and 30 degrees or less. When an angle (acute angle) between the bottom surface 20BS of the bottom wall 20B and the inner wall surface of the second inclined wall 20L2 in the virtual plane is set as α2, an inclination angle of the second inclined wall 20L2 with respect to the left lower side wall 20LL is (90−α2).

However, α1 and α2 may not be the same. In contrast, α1 may be the same or substantially the same as α2.

[Displacement Amount (Shift Amount) Between Upper Side Wall and Lower Side Wall]

A displacement amount D1 between the right upper side wall 20RU and the right lower side wall 20RL in the axial direction substantially corresponds to a displacement amount of the staple sheet SS in the refill 10 in the axial direction. Here, the displacement amount D1 is preferably set to 6% to 8% of an interval between the inner wall surface 20LS of the left side wall 20L and the inner wall surface 20RS of the right side wall 20R. Specifically, the displacement amount D1 is preferably 1.6 mm or more and 2.2 mm or less.

The displacement amount of the stacked staple sheet SS in the axial direction is small when the displacement amount D1 is too small, and on the other hand, the width of the refill 10 in the left-right direction is too large when the displacement amount D1 is too large. By setting the displacement amount D1 as described above, the displacement amount of the staple sheet SS in the axial direction can be secured while reducing an increase in the width of the refill 10 in the left-right direction. The displacement amount D1 corresponds to a difference in axial position between the upper end and the lower end of the first inclined wall 20R1 in the cross-sectional view (FIG. 4B) taken along the virtual plane.

Similarly, a displacement amount D2 between the left upper side wall 20LU and the left lower side wall 20LL in the axial direction substantially corresponds to a displacement amount of the staple sheet SS in the refill 10 in the axial direction. Here, the displacement amount D2 is preferably set to 6% to 8% of an interval between the inner wall surface 20LS of the left side wall 20L at the lower end (left lower side wall 20LL) and the inner wall surface 20RS of the right side wall 20R at the lower end (right lower side wall 20RL). Specifically, the displacement amount D2 is preferably 1.6 mm or more and 2.2 mm or less.

As described above, according to the present embodiment, a refill capable of preventing the blocking can be provided.

[Modification of Refill]

Hereinafter, a modification of the refill 10 will be described.

FIG. 13A to FIG. 13D are schematic diagrams each showing a modification of the second side wall (left side wall 20L of the refill 10).

The left side wall of each modification includes the left lower side wall 20LL, the left upper side wall 20LU provided at a position displaced in the axial direction AD from the left lower side wall 20LL, and the second inclined wall extending in the upper-lower direction while being displaced in the axial direction.

As will be understood by those skilled in the art, since the second inclined wall is not necessarily in contact with the staple sheet SS, various modifications are possible.

Like a second inclined wall 120L2 of a left side wall 120L which is a first modification as shown in FIG. 13A, only an outer wall surface of the second inclined wall may be inclined, and an inner wall surface may not be inclined. For example, the inner wall surface may include vertical and horizontal wall surfaces.

Like a second inclined wall 220L2 of a left side wall 220L which is a second modification as shown in FIG. 13B, an opening may be formed in a part of the second inclined wall.

Like a second inclined wall 320L2 of a left side wall 320L which is a third modification as shown in FIG. 13C, the second inclined wall may be provided by alternately forming vertical and horizontal outer wall surfaces and inner wall surfaces.

Like a second inclined wall 420L2 of a left side wall 420L which is a fourth modification as shown in FIG. 13D, the second inclined wall may be formed to have an outer wall surface and/or an inner wall surface formed by a curve such as a curved surface.

FIG. 13E and FIG. 13F are schematic diagrams each showing a modification of the first side wall (right side wall 20R of the refill 10).

The right side wall of each modification includes the right lower side wall 20RL, the right upper side wall 20RU provided at a position displaced in the axial direction AD from the right lower side wall 20RL, and the first inclined wall extending in the upper-lower direction while being displaced in the axial direction.

As will be understood by those skilled in the art, the first inclined wall only needs to be formed to displace the stacked staple sheets SS in the axial direction, various modifications are possible.

Like a first inclined wall 520R1 of a right side wall 520R which is a fifth modification as shown in FIG. 13E, the first inclined wall may be formed to have an outer wall surface and/or an inner wall surface formed by a curve such as a curved surface.

Like a first inclined wall 620R1 of a right side wall 620R which is a sixth modification as shown in FIG. 13F, the first inclined wall may be formed to have an outer wall surface and/or an inner wall surface on which fine irregularities are formed.

Figure 14:
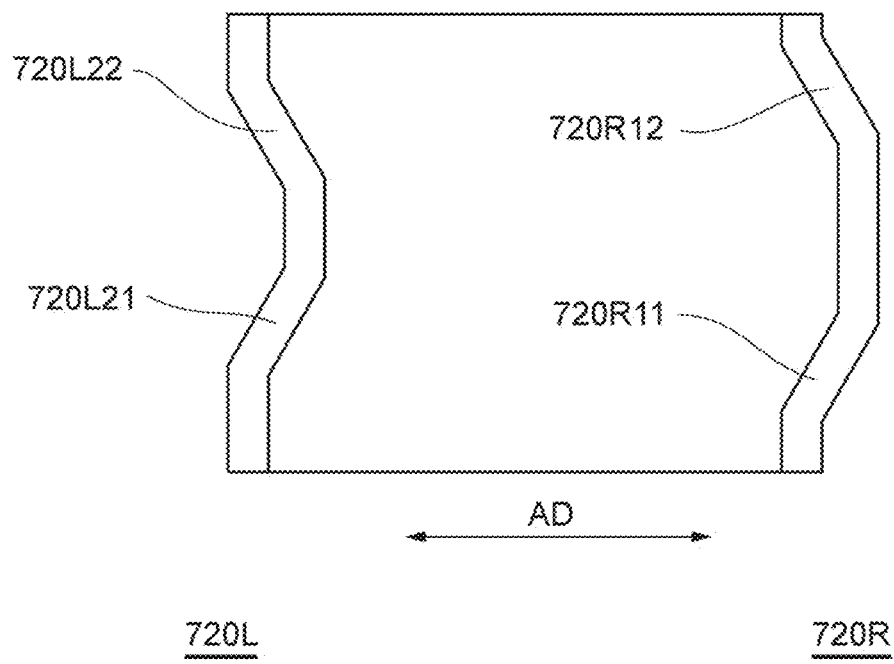
FIG. 14 is a schematic diagram showing a modification of the refill according to the embodiment.

FIG. 14 is a schematic diagram showing a further modification of the first side wall and the second side wall. As shown in the figure, in a seventh modification, a left side wall 720L may include, as a plurality of inclined walls, an inclined wall 720L21 and an inclined wall 720L22 provided above the inclined wall 720L21. Here, the inclined wall 720L21 and the inclined wall 720L22 may be formed to be inclined in the same direction, or may be formed to be inclined in opposite directions as shown in the figure. Similarly, a right side wall 720R may include, as a plurality of inclined walls, an inclined wall 720R11 and an inclined wall 720R12 provided above the inclined wall 720R11. Here, the inclined wall 720R11 and the inclined wall 720R 12 may be formed to be inclined in the same direction, or may be formed to be inclined in opposite directions as shown in the figure.

However, it is preferable that the inclined wall 720L21 and the inclined wall 720R11 which are at least partially formed at the same height are inclined in the same direction. Similarly, it is preferable that the inclined wall 720L22 and the inclined wall 720R12 which are at least partially formed at the same height are inclined in the same direction.

According to such a configuration, the staple sheets SS placed between the inclined wall 720L22 and the inclined wall 720R12 can be displaced in the axial direction. Further, the staple sheets SS placed between the inclined wall 720L21 and the inclined wall 720R11 can also be displaced in the axial direction.

The refill shown in the embodiment and the modifications may not actually accommodate the staple sheets SS as long as the refill is configured to accommodate the staple sheets SS. Such a refill includes the bottom wall 20B; the first side wall (right side wall 20R) erected in a first direction (upward direction) from the bottom wall 20B; the second side wall (left side wall 20L) facing the first side wall (right side wall 20R) and erected in the first direction (upward direction) from the bottom wall 20B; and the front wall 20F which couples an end portion of the first side wall (right side wall 20R) in a second direction (forward direction) orthogonal to the first direction (upward direction) and an end portion of the second side wall (left side wall 20L) in the second direction (forward direction), and in which the discharge opening 20FO for discharging the staple sheets SS placed on the bottom wall 20B in the second direction (forward direction) is formed at a position adjacent to the bottom wall 20B in a third direction (downward direction) that is an opposite direction of the first direction (upward direction). Here, the first side wall (right side wall 20R) includes, in a part thereof in the first direction (upward direction), the first inclined wall 20R1 extending in the second direction (forward direction) and inclined in a fourth direction (leftward or rightward direction) orthogonal to the first direction (upward direction) and the second direction (forward direction).

Further, the second side wall (left side wall 20L) may include, in a part thereof in the first direction (upward direction), the second inclined wall 20L2 extending in the second direction (forward direction) and inclined in the fourth direction (leftward or rightward direction) orthogonal to the first direction (upward direction) and the second direction (forward direction).

According to the refill having the above-described configuration, since a plurality of staple sheets SS can be stacked and accommodated such that the staple sheets SS are displaced in the axial direction, the blocking can be prevented.

Further, the refill according to a further modification is a refill including a bottom wall; an L-th staple sheet (L is an integer of 1 or more) obtained by coupling a plurality of staples, each of which extends in an axial direction thereof, in a coupling direction orthogonal to the axial direction and placed on the bottom wall at an L-th order from the bottom; an M-th staple sheet (M is an integer larger than L) obtained by coupling a plurality of staples, each of which extends in the axial direction, in the coupling direction orthogonal to the axial direction, to be displaced from the L-th staple sheet in a first direction (leftward or rightward direction) parallel to the axial direction, and stacked above the L-th staple sheet at an M-th order from the bottom; an N-th staple sheet (N is an integer larger than M) obtained by coupling a plurality of staples, each of which extends in the axial direction, in the coupling direction orthogonal to the axial direction, to be displaced from the M-th staple sheet in the first direction (leftward or rightward direction), and stacked above the M-th staple sheet at an N-th order from the bottom; and an inner wall surface for displacing the N-th staple sheet and the M-th staple sheet in a second direction (leftward or rightward direction) opposite to the first direction that is parallel to the axial direction, and the refill is configured to allow the staple sheets to be discharged in a direction perpendicular to the first direction, the second direction and a stacking direction of the staple sheets.

According to the refill having the above-described configuration, since a plurality of staple sheets are stacked and placed such that the M-th staple sheet is displaced in the axial direction with respect to the L-th staple sheet by the inner wall surface of a side wall, and the N-th staple sheet is displaced in the axial direction with respect to the M-th staple sheet by the inner wall surface, a refill that prevents blocking can be provided. When L=1, the first staple sheet corresponds to the lowermost staple sheet SS. When applied to the refill 10 of a first embodiment, the staple sheet SS facing the right lower side wall 20RL may correspond to the L-th staple sheet. For example, when the staple sheets SS facing the right lower side wall 20RL are first to tenth staple sheets SS from the bottom (that is, when the height of the upper end of the right lower side wall 20RL is about ten times the thickness of the staple sheet SS), any integer selected from 1 to 10 may correspond to L. The staple sheet SS facing the first inclined wall 20R1 may correspond to the M-th staple sheet. For example, when the staple sheets SS facing the first inclined wall 20R1 are eleventh to thirtieth staple sheets SS from the bottom, any integer selected from 11 to 30 may correspond to M. The staple sheet SS which is a staple sheet SS on an upper layer of the M-th staple sheet and faces the first inclined wall 20R1 and the right upper side wall 20RU may correspond to the N-th staple sheet.

Here, typically, the inner wall surface of the side wall is formed to be inclined in a direction approaching the second direction as advancing downward. In the refill having the above-described configuration, a structure of each configuration (for example, the second inclined wall) described in the present embodiment and the like may be further added.

[Cartridge]

Figure 15:
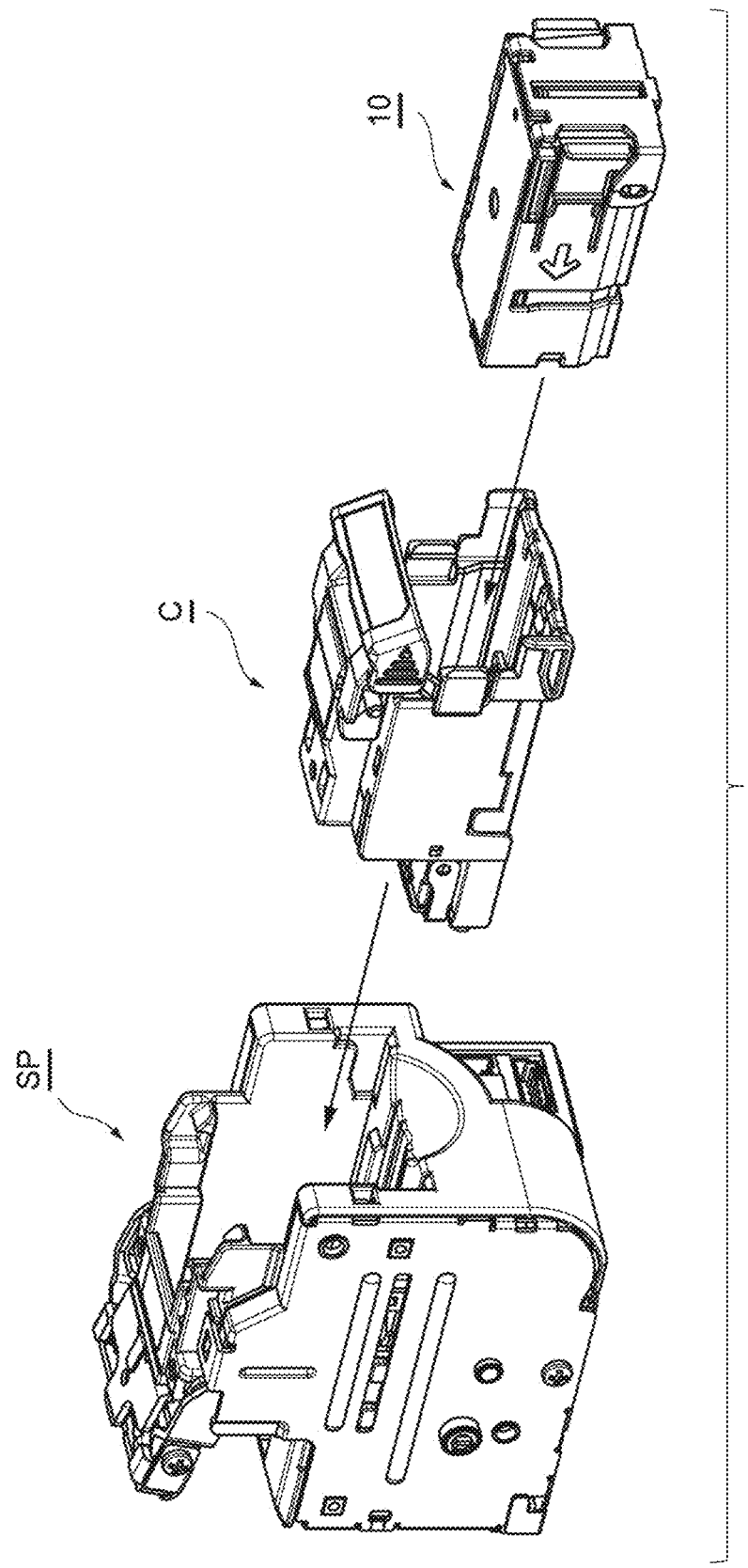
FIG. 15 is a perspective view of the refill, the cartridge, and an electric stapler according to the embodiment.

The cartridge C according to the present embodiment is configured such that the refill 10 is attachable thereto and detachable therefrom. FIG. 15 is a perspective view showing a state where the refill 10 is attached to the cartridge C, and the cartridge to which the refill 10 is attached is further attached to the electric stapler SP.

As shown in the figure, the refill 10 is attached to the cartridge C by being moved forward from the rear of the cartridge C. After all of the accommodated staple sheets SS are consumed, the refill 10 is separated from the cartridge C by being moved rearward with respect to the cartridge C.

The cartridge C can adopt a known configuration disclosed in, for example, Patent Literature 1, and includes a feeding portion CD1 (FIG. 12A) that is provided in front of the refill 10, shapes the staple S (sometimes referred to as a "staple") positioned at a front end of the staple sheet SS fed out from the refill 10 into a U-shape by a forming plate, and then performs a binding process of driving the shaped staple onto paper using a driver plate and clinching the staple that has penetrated the paper; and the urging member CSP for pressing downward the upper surface 30US of the upper lid portion 30 of the refill 10 attached to the cartridge C.

In addition to the configuration described above, the cartridge C according to the present embodiment includes, in a cross section taken along a virtual plane perpendicular to the front-rear direction and passing through the first inclined wall 20R1 and the second inclined wall 20L2 of the refill 10 when the refill 10 is attached, a first inner wall facing the first inclined wall 20R1 and having a first cartridge inclined surface CIS1 (FIG. 10A) that advances inward as advancing downward; and a second inner wall facing the second inclined wall 20L2 and having a second cartridge inclined surface CIS2 that advances inward as advancing upward.

Further, the cartridge C may include a wall portion CS (stopper CS) formed to protrude inward so as to be positioned rearward of the first lid projection portion 30P1 of the upper lid portion 30 protruding from the opening 20RO of the first inclined wall 20R1 when one or two staple sheets in refill 10 that is attached to the cartridge C. Here, the wall portion CS may be configured to be positioned above the first lid projection portion 30P1 of the upper lid portion 30 when there is no staple sheet in the refill 10, thus permitting rearward movement of the refill 10 with respect to the cartridge C.

As shown in the figure, the cartridge C to which the refill 10 is attached is further attached to the electric stapler SP. The electric stapler SP may adopt a known configuration.

The electric stapler SP is attached to, for example, a finisher of a multifunction device. According to the refill 10 of the present embodiment, a space in the front-rear direction as compared with the comparative configuration can be reduced, so that a reduction in size of the finisher in the front-rear direction can be promoted.

As described above, according to the present invention, a refill capable of preventing the blocking can be provided.

In addition, various modifications can be made without departing from the gist of the present invention. For example, a part of the constituent elements disclosed in a certain embodiment or a certain modification can be added to another modification within the scope of the ordinary creativity of those skilled in the art. Further, a part of the constituent elements disclosed in a certain embodiment or a certain modification can be replaced with corresponding constituent elements of another modification. For example, the refill 10 may not necessarily include the upper lid portion 30. For example, the refill 10 and the cartridge C may be modified such that the refill 10 does not include the upper lid portion 30 and the cartridge C includes a lid portion corresponding to the upper lid portion 30. FIG. 3D shows an example of the refill 10 not including the upper lid portion 30.

APPENDIX

The invention disclosed in the present application is hereinafter described in different expressions. As will be understood by those skilled in the art, other configurations described in the present embodiment may be added to the invention described in each appendix. For example, an invention according to any one of the refills described in Appendix A1, Appendix B1, and Appendix C1 may include the first inclined wall and the second inclined wall described in the present embodiment, or may include only the second inclined wall in the first inclined wall and the second inclined wall.

Appendix A1

A refill including:
a bottom wall configured to allow a staple sheet obtained by coupling a plurality of staples, each of which extends in an axial direction thereof, in a coupling direction orthogonal to the axial direction to be placed thereon; and
a front wall in which a discharge opening for discharging the staple sheet in the coupling direction is formed, in which
the bottom wall includes:
a rear end portion serving as a fixed end,
an extending portion extending from the rear end portion in the coupling direction, and
a front end portion extending in an upward direction from a front end of the extending portion, disposed in at least a part of a region in front of the discharge opening to block at least a part of the discharge opening, and serving as a free end.

Appendix A2

The refill according to Appendix A1, in which the extending portion includes a pressing surface configured to move the front end portion downward by receiving an external force.

Appendix A3

The refill according to Appendix A2, in which the pressing surface has an inclined surface facing the upward direction and a forward direction that is a discharge direction of the staple sheet.

Appendix A4

The refill according to Appendix A2 or A3, in which the extending portion includes, in a portion between the pressing surface and the rear end portion, a thin portion whose thickness in an upper-lower direction reduces.

Appendix B1

A refill including:
a bottom wall configured to allow a staple sheet obtained by coupling a plurality of staples, each of which extends in an axial direction thereof, in a coupling direction orthogonal to the axial direction to be stacked and placed thereon;
a first side wall facing one end portion of the stacked staple sheet in the axial direction;
a second side wall facing the other end portion of the stacked staple sheet in the axial direction; and
a front wall configured to allow the staple sheet to be discharged in the coupling direction, in which
the second side wall includes a second engagement wall portion configured to be displaced inward approaching the first side wall and having a second projection portion for engaging with a cartridge by protruding outward away from the first side wall.

Appendix B2

The refill according to Appendix B1, in which
the second engagement wall portion includes:
a front end portion serving as a fixed end,
an extending portion extending from the front end portion in a rearward direction opposite to a discharge direction of the staple sheet, and a rear end portion provided behind the extending portion and serving as a free end.

Appendix B3

The refill according to Appendix B2, in which
a height of a lower end of the rear end portion from a bottom surface of the bottom wall portion is smaller than a height of a lower end of the extending portion from the bottom surface of the bottom wall portion.

Appendix B4

The refill according to any one of Appendices B1 to B3, in which when the refill is attached to the cartridge, the second projection portion of the refill is engaged with a second recessed portion formed in the cartridge.

Appendix B5

The refill according to any one of Appendices B1 to B4, in which, the second side wall includes, in a part thereof in a stacking direction in which the staple sheet is stacked, a second inclined wall extending in the coupling direction of the staples and inclined in the axial direction.

Appendix B6

The refill according to any one of Appendices B1 to B5, in which
the second side wall includes:
a second inclined wall inclined in a direction approaching the first side wall as advancing downward, and
a second upper side wall located above the second inclined wall and formed to extend in the stacking direction continuously with the second inclined wall,
an opening extending in an upper-lower direction from at least a part of the second upper side wall to at least a part of the second inclined wall is formed in the second side wall,
the refill further includes a lid portion configured to be moved downward to be placed on an upper surface of the uppermost staple sheet, and including a lid projection portion to be engaged with the opening, and
the lid projection portion is in a region in the opening of the second inclined wall when being at a height facing the second upper side wall, and protrudes from the opening of the second inclined wall when being at a height facing the second inclined wall.

Appendix B7

The refill according to Appendix B6, in which when the refill is attached to the cartridge, rearward movement of the lid projection portion of the refill is restricted by a stopper for the refill provided in the cartridge at a position advancing rearward from the lid projection portion of the refill.

Appendix B8

The refill according to Appendix B7, in which when the lid portion comes into contact with a bottom surface of the bottom wall, the lid projection portion of the refill is configured to be moved rearward by passing below the stopper for the refill.

Appendix B9

The refill according to any one of Appendices B1 to B8, in which the first side wall includes:
a first engagement wall portion configured to be displaced inward approaching the second side wall and having a first projection portion for engaging with the cartridge by protruding outward away from the second side wall.

Appendix C1

A refill including:
a bottom wall configured to allow a staple sheet obtained by coupling a plurality of staples, each of which extends in an axial direction thereof, in a coupling direction orthogonal to the axial direction to be stacked and placed thereon;
a front wall configured to allow the staple sheet to be discharged in the coupling direction; and
a lid portion configured to be moved downward to be placed on an upper surface of the staple sheet on an uppermost layer and having an upper surface to be pressed downward by an urging member of a cartridge, in which
an upper surface of the lid portion includes:
a front end portion corresponding to an end portion in the coupling direction in which the staple sheet is discharged,
a first region pressed by the urging member of the cartridge when the staple sheet is placed on the bottom wall, and
a second region advanced in the coupling direction in which the staple sheet is discharged from the first region and connected to the front end portion, and
the first region and the second region are formed to be smooth.

Appendix C2

The refill according to Appendix C1, in which in a state where the refill is attached to the cartridge, when the refill is separated from the cartridge by relatively moving the refill rearward with respect to the cartridge, the urging member of the cartridge moves from the first region to the front end portion while being in contact with the second region.

What is claimed is:
1. A refill comprising:
a staple sheet obtained by coupling a plurality of staples, each of which extends in an axial direction, in a direction orthogonal to the axial direction;
a bottom wall on which a plurality of the staple sheets are stacked and placed;
a first side wall facing one end portion of each of the stacked staple sheets in the axial direction and erected in a stacking direction from the bottom wall;
a second side wall facing another end portion of each of the stacked staple sheets in the axial direction and erected in the stacking direction from the bottom wall; and
a front wall positioned between an end portion of the first side wall in a coupling direction of the staples and an end portion of the second side wall in the coupling direction of the staples and in which a discharge opening for discharging the staple sheets in the coupling direction of the staples is formed, wherein the first side wall includes, in a part thereof in the stacking direction, a first inclined wall extending in the coupling direction of the staples and inclined in the axial direction, the second side wall includes, in a part thereof in the stacking direction, a second inclined wall extending in the coupling direction of the staples and inclined in the axial direction, and the first inclined wall and the second inclined wall are inclined in the same direction, and at least a part of the first inclined wall and at least a part of the second inclined wall are formed at the same height from a bottom surface of the bottom wall in the stacking direction.

2. The refill according to claim 1, wherein when a direction toward the bottom wall in the stacking direction is set as a downward direction and an opposite direction of the downward direction is set as an upward direction, the first inclined wall is inclined in a direction approaching the second side wall toward the downward direction, and a height of an upper end of the first inclined wall from the bottom surface of the bottom wall in the stacking direction is smaller than a height of an upper end of the second inclined wall from the bottom surface of the bottom wall in the stacking direction, and a height of a lower end of the first inclined wall from the bottom surface of the bottom wall in the stacking direction is smaller than a height of a lower end of the second inclined wall from the bottom surface of the bottom wall in the stacking direction.

3. The refill according to claim 2, wherein the first side wall includes a first lower side wall formed to be erected from the bottom wall in the stacking direction, the first inclined wall located on the upward direction of the first lower side wall and formed continuously with the first lower side wall, and a first upper side wall located on the upward direction of the first inclined wall and formed to extend in the stacking direction continuously with the first inclined wall.

4. The refill according to claim 3, wherein a difference between the height of the upper end of the first inclined wall from the bottom surface of the bottom wall in the stacking direction and the height of the upper end of the second inclined wall from the bottom surface of the bottom wall in the stacking direction is equal to or larger than a thickness of one staple sheet, and a difference between the height of the lower end of the first inclined wall from the bottom surface of the bottom wall in the stacking direction and the height of the lower end of the second inclined wall from the bottom surface of the bottom wall in the stacking direction is equal to or larger than the thickness of the one staple sheet.

5. The refill according to claim 4, wherein a height of the first lower side wall from the bottom surface of the bottom wall in the stacking direction is equal to or larger than half of the thickness of the one staple sheet.

6. The refill according to claim 5, wherein the first inclined wall is inclined with respect to the first lower side wall by an angle of 10 degrees or more and 30 degrees or less.

7. The refill according to claim 6, wherein the first inclined wall is located in the upward direction with respect to the discharge opening in the stacking direction.

8. The refill according to claim 3, wherein a displacement amount between the first upper side wall and the first lower side wall in the axial direction is set to 6% to 8% of an interval between an inner wall surface of the second side wall and an inner wall surface of the first side wall.

9. The refill according to claim 1, wherein an inclination angle of the first inclined wall is substantially the same as an inclination angle of the second inclined wall.

10. The refill according to claim 1, wherein a length of the first inclined wall is substantially the same as a length of the second inclined wall.

11. A refill comprising:

a bottom wall;

a first side wall erected in a first direction from the bottom wall;

a second side wall facing the first side wall and erected in the first direction from the bottom wall; and a front wall positioned between an end portion of the first side wall in a second direction orthogonal to the first direction and an end portion of the second side wall in the second direction, and in which a discharge opening for discharging a staple sheet to be placed on the bottom wall in the second direction is formed at a position adjacent to the bottom wall in a third direction that is an opposite direction of the first direction, wherein the first side wall includes, in a part thereof in the first direction, a first inclined wall extending in the second direction and inclined in a fourth direction orthogonal to the first direction and the second direction, the second side wall includes, in a part thereof in the first direction, a second inclined wall extending in the second direction and inclined in the fourth direction, and the first inclined wall and the second inclined wall are inclined in the same direction, and at least a part of the first inclined wall and at least a part of the second inclined wall are formed at the same height from a bottom surface of the bottom wall in the first direction.

12. The refill according to claim 11, wherein the first inclined wall is inclined in a direction approaching the second side wall toward the third direction, and a height of an upper end of the first inclined wall from the bottom surface of the bottom wall in the first direction is smaller than a height of an upper end of the second inclined wall from the bottom surface of the bottom wall in the first direction, and a height of a lower end of the first inclined wall from the bottom surface of the bottom wall in the first direction is smaller than a height of a lower end of the second inclined wall from the bottom surface of the bottom wall in the first direction.

13. The refill according to claim 12, wherein the first side wall includes a first lower side wall formed to be erected from the bottom wall in the first direction, the first inclined wall formed at a position advancing in the first direction with respect to the first lower side wall continuously with the first lower side wall, and a first upper side wall formed at a position advancing in the first direction with respect to the first inclined wall and extending in the first direction continuously with the first inclined wall.

14. The refill according to claim 13, wherein
a difference between the height of the upper end of the first inclined wall from the bottom surface of the bottom wall in the first direction and the height of the upper end of the second inclined wall from the bottom surface of the bottom wall in the first direction is equal to or larger than a thickness of one staple sheet, and a difference between the height of the lower end of the first inclined wall from the bottom surface of the bottom wall in the first direction and the height of the lower end of the second inclined wall from the bottom surface of the bottom wall in the first direction is equal to or larger than the thickness of the one staple sheet.

15. The refill according to claim 14, wherein
a height of the first lower side wall from the bottom surface of the bottom wall in the first direction is equal to or larger than half of the thickness of the one staple sheet.

16. The refill according to claim 15, wherein
the first inclined wall is inclined with respect to the first lower side wall by an angle of 10 degrees or more and 30 degrees or less.

17. The refill according to claim 16, wherein
the first inclined wall is formed at a position advancing in the first direction with respect to the discharge opening.

18. The refill according to claim 13, wherein
a displacement amount between the first upper side wall and the first lower side wall in the fourth direction is set to 6% to 8% of an interval between an inner wall surface of the second side wall and an inner wall surface of the first side wall.

19. The refill according to claim 11, wherein
an inclination angle of the first inclined wall is substantially the same as an inclination angle of the second inclined wall.

20. The refill according to claim 11, wherein
a length of the first inclined wall is substantially the same as a length of the second inclined wall.

* * * * *